United States Patent [19]

Sinclair

[11] Patent Number: 4,882,706
[45] Date of Patent: Nov. 21, 1989

[54] DATA STORAGE ELEMENT AND MEMORY STRUCTURES EMPLOYING SAME

[75] Inventor: Alan W. Sinclair, Cambridge, England

[73] Assignee: Anamartic Limited, London, England

[21] Appl. No.: 6,720
[22] PCT Filed: Jun. 9, 1986
[86] PCT No.: PCT/GB86/00328
§ 371 Date: Feb. 5, 1987
§ 102(e) Date: Feb. 5, 1987
[87] PCT Pub. No.: WO86/07487
PCT Pub. Date: Dec. 18, 1986

[30] Foreign Application Priority Data
Jun. 7, 1985 [GB] United Kingdom ............... 8514452

[51] Int. Cl.$^4$ ................ G11C 11/34; G11C 7/00; G11C 8/00
[52] U.S. Cl. .................... 365/180; 365/181; 365/189.02; 365/230.02; 365/230.05
[58] Field of Search .............. 365/180, 181, 148, 149, 365/230, 189.02, 230.02, 230.05; 307/238, 288

[56] References Cited
U.S. PATENT DOCUMENTS
3,697,962 10/1972 Beausoleil et al. ................ 365/181
3,715,732 2/1973 Lynes ................................ 307/238
3,729,719 4/1973 Wiedmann ........................ 365/180
3,753,248 8/1973 Lynes ................................ 307/238
3,876,992 4/1975 Pricer ................................ 307/238
3,992,703 11/1976 Luisi et al. ........................ 365/181
4,037,243 7/1977 Hoffman et al. .................. 357/23
4,181,981 1/1980 El-Kareh et al. ................. 365/181

FOREIGN PATENT DOCUMENTS
0055347 7/1982 European Pat. Off. .
2296939 7/1976 France .

OTHER PUBLICATIONS
IBM Technical Disclosure Bulletin, vol. 20, No. 9, 2/78, "Single-Device DC Stable Memory Cell", S. D. Malaviya, pp. 3492-3494.
IBM Technical Disclosure Bulletin, vol. 22, No. 1, 6/1979, "Integrated Static SCR Memory Cell", H. D. Varadarajan, R. T. Farley, pp. 135-136.

Primary Examiner—Stuart N. Hecker
Assistant Examiner—Melissa J. Koval
Attorney, Agent, or Firm—Nixon & Vanderhye

[57] ABSTRACT

An electrical data storage element which provides for alteration of this stored data by way of a data line and address lines. Data is held as a charge set on a charge storage device. The state of the switch elements is sensed by way of the data line and address line.

29 Claims, 20 Drawing Sheets

FIG. 9  SHIFT REGISTER LOAD

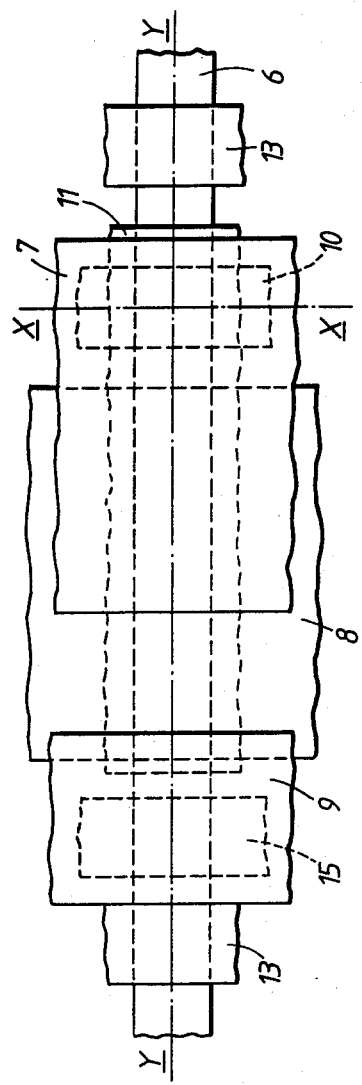
FIG.1/a.
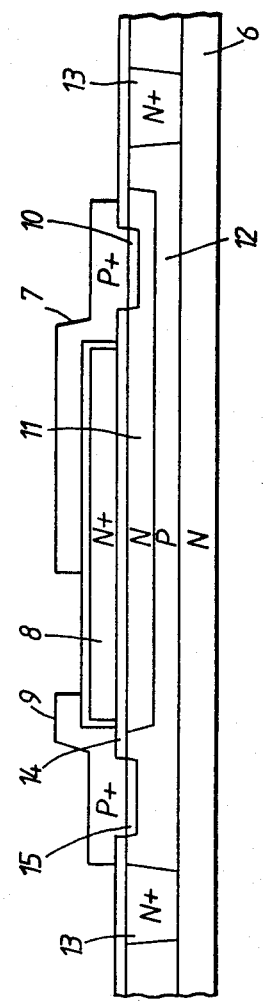
FIG.1/b.
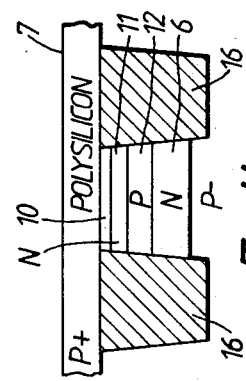
FIG.1/c.

STACK DATA INPUT SEQUENCE (WRITE)
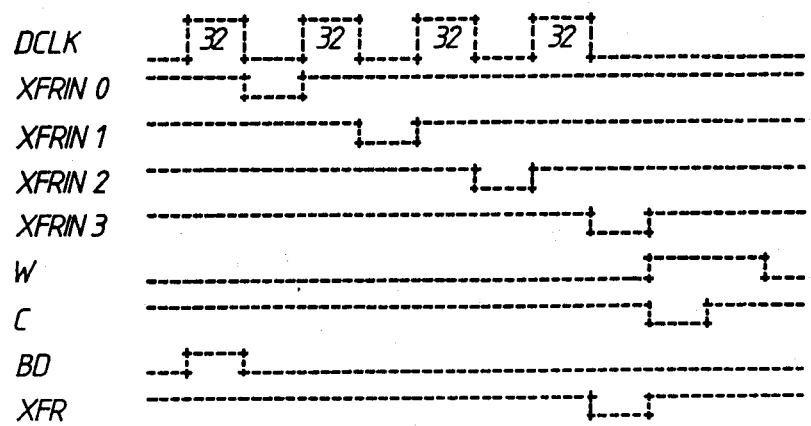
STACK DATA OUTPUT SEQUENCE (READ)
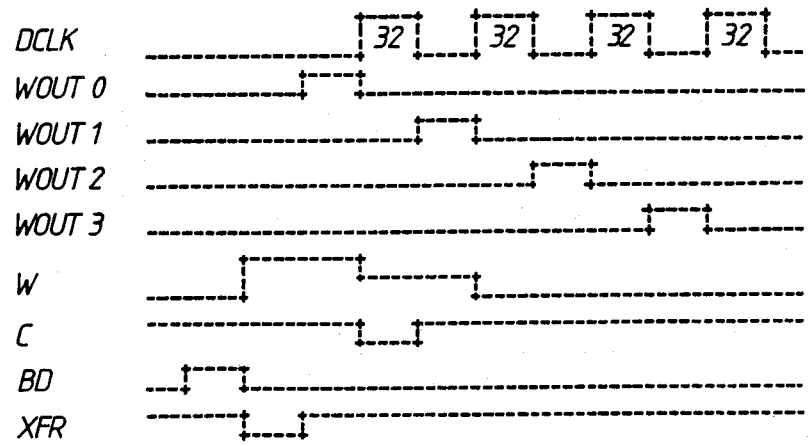
FIG. 22.

DATA STORAGE ELEMENT AND MEMORY STRUCTURES EMPLOYING SAME

The present invention relates to electrical data storage elements.

An electrical data storage element is, at present, a device capable of being placed in one of two possible conditions by a stimulus applied by way of control ports and which will retain the selected condition after the removal of the stimulus. After being set to the selected condition, the electrical data storage element is regarded as storing data represented by the stimulus. The data represented by the stimulus may be retrieved from the data storage element by determining its condition. The electrical data storage element may be such that the selected condition is reversible, in which case its data may be altered any number of times, or the selected condition may be irreversible, in which case its data cannot be altered.

A known electrical data storage element the data in which is alterable includes electrical charge storage means connectible, by means of switch means, to a first of two address lines which represent the coordinates of the storage element, the other of the two address lines being arranged to permit closure of the switch means to connect the charge storage means to the first address line. Sensing of the condition of the storage element is performed by means of a sensing amplifier for sensing the condition of storage means by way of the first address line with the switch means closed.

The known electrical data storage element is subject to various difficulties, including, for example, sensing reliably the relatively small charge on the storage element at a remote position in the presence of noise and other electrical disturbances in and around the sensing amplifier.

The present invention provides an electrical data storage element which provides for alteration of its stored data and which avoids at least the sensing difficulty encountered in known electrical data storage elements.

In accordance with the present invention, an electrical data storage element which provides for alteration of its stored charge, includes electrical charge storage means arranged to so control switch means by way of one of first and second control ports of the switch means such that the switch means assumes a first state when the charge on the charge storage means lies within a first range and the switch means assumes a second state when the charge on the charge storage means lies within a second range which excludes the first range, a first address line connected to a first region of the switch means, a second address line connected to the charge storage means, and a data line connected to a second region of the switch means, so that, in operation, the data to be held by the data storage element is written into it as a charge set on the charge storage means by signals applied to the data storage element by way of the address lines and the data line, and the data held by the data storage element is read by sensing the state of the switch means by way of the first address line and the data line.

More specifically, the electrical data storage element includes switch means arranged as interconnected first and second switch elements and including first and second control ports for effecting combined operation of the first and second switch elements resulting in the switch means assuming its closed circuit condition, a first address line connected to the first switch element, a second address line, the electrical charge storage means connected between the first control port and the second address line, and, the data line connected to the second switch element, so that in operation, the charge condition of the charge storage means is set by independent control of the switch elements by way of the first address line and the data line in writing data into the data storage element, the charge condition of the charge storage means being effective to cause the switch means to assume its closed circuit condition or to remain open circuit when the data storage element is read, the condition of the switch means being sensed by way of the first address line and the data line.

The switch means may be a four-layer semiconductor device (PNPN) with a first gate electrode connected to the second layer to provide the first control port and a second gate electrode connected to the third layer, to provide the second control port, the first switch elements including the upper three layers (PNP) of the device and the second switch element including the lower three layers (NPN) of the device.

The switch means may, of course, be regarded as including a first (PNP) switching device and a second (NPN) switching device arranged as a regenerative (PNPN) switch, the address and data lines of the electrical data storage element being so arranged as to permit independent operation of the switching devices in the writing of data to the storage element.

More specifically, the data storage element includes a four-layer semiconductor device (PNPN), in which the first address line is connected to the first layer of the four-layer device, the second address line is connected to the second layer of the four-layer device by way of a capacitive element, the data line is connected to the fourth layer of the four layer device, and the third layer of the four-layer device is connected to a further line of the data storage element by way of a resistive element.

Signals may be applied to the further line to provide additional control of the charge conditions of the charge storage means.

The further line port may be maintained at a fixed voltage level, preferably zero voltage level, in which case the charge conditions of the charge storage means are determined to a degree by the characteristics of the switch means.

In an arrangement in which the further line port is maintained at a fixed voltage level (usually zero voltage level), the capacitance of the data line is used to store charge for transfer as data into the data storage element, and subsequent reading of the data from the data storage element leaves the data line charged correspondingly to the data stored in the data storage element, this situation permitting the return of the data line charge to the data storage element to effect refreshing of the data storage element.

In an arrangement in which signals are applied to the further line, an additional data storage element is employed with an array of data storage elements as a means of refreshing data held by the data storage elements, the data being passed from the data storage elements of the array to the additional data storage elements and being returned to the data storage elements of the array to refresh them.

The data storage element is particularly suitable for implementation as a monolithic semiconductor structure, including first layer (P-type), a second layer (N- type), and a third layer (P type), the layers being of generally rectangular form having their major dimensions set in the same direction with the first layer lying wholly within the second layer and the second layer lying wholly within the third layer, the capacitive element being provided by part of the second layer, an N-type semiconductor strip, a dielectric layer separating the part of the second layer from the N-type conductor strip, the resistive element being provided by the bulk resistance of part of the third layer along which lies a P-type semiconductor strip, and a fourth N-type layer of generally rectangular shape having its major dimension in a direction orthogonal to the main dimensions of the other layers.

In the monolithic form of the data storage element, the fourth layer, which is a heavily doped layer, acts as a trap for stray charges generated in the substrate material of the monolithic structure and protects the charge stored from corruption by stray charges.

The electrical data storage elements may, advantageously, be arranged in an array which may be a single row of data storage elements with shared address lines and individual data lines. However, the preferred arrangement for an array of the data storage elements comprises a plurality of rows of the data storage elements with the elements of each row connected to the address lines which are set along the rows, and the elements of each column connected to the data lines which are set along the columns.

In an array in which the second control ports of the data storage elements are provided with control signals, the orientations of the elements are the same throughout the array.

In an array in which the second control ports of the data storage elements are held at a fixed voltage level, the orientations of the elements may alternate from row to row to provide rows in pairs in which the elements are mirror images of each other and in which, preferably, the elements of the pairs of rows have a common connection to the second control ports.

In the monolithic form of an array of the data storage elements, the data storage elements are preferably arranged in a uniform pattern of rows and columns, the address lines and lines to the second control ports are set along the rows and are connected to the elements in the rows, and the date lines are set along the columns and are connected to the elements in the columns. Preferably, the address lines and the lines to the second control ports are set on the surface of the monolithic structure and the data lines are set within the monolithic structure.

Advantageously, the data storage elements are arranged as a memory block, and a memory block may include an array of data storage elements in which the second control ports are provided with control signals, an additional memory element for each column of the array for refreshing the elements of the array, and transfer gates for moving data into and out of the array.

Alternatively, a memory block may include an array of data storage elements in which the second control ports are held at a fixed voltage level and transfer gates for moving data into and out of the array, the refreshing of the elements of the array being carried out internally by the elements.

The memory block may include an interleaved array of data storage elements in which the data storage elements of the array belong to two separate sub-arrays the elements of which are dispersed throughout the array, the data lines of the sub-arrays being connected through respective groups of transfer switches to input lines each of which is connected to a switch to a data line for one sub-array and to a switch to a data line for the other sub-array. The interleaved array of data storage elements introduces a degree of fault tolerance to the array by providing alternative paths through the array. In an interleaved array in which the sub-arrays are identified as "odd" and "even", preferably the order of data storage elements in each row is "odd", "even", "even", "odd", "odd", "even", "even", "odd", and so on.

The memory blocks may be arranged as a stack, that is, memory blocks positioned one above the other, with communicating transfer gates between the memory blocks to facilitate the flow of data through the stack. In a stack of the memory blocks, the number of data storage elements in each row will be the same and will set the bit-width of the memory stack.

The memory blocks may, alternatively, be arranged side by side with row address decoders for selecting one row through the blocks and column address decoders for selecting one of the blocks, providing a row and column addressable memory capable of storing data words with the width of the array of each blocks. Preferably, the memory blocks are separated by row buffers which act as repeaters for the row address signals to reduce the power required from the row drivers.

The stack of memory blocks may include an input demultiplexer and an output multiplexer in combination with shift registers to facilitate the transfer of data to and from the memory stack in word-lengths shorter than the full width of the stack.

Preferably, the output multiplexer comprises data storage elements in accordance with the present invention, the multiplexer function being achieved by the use of particular address, control and data signals.

An electrical data storage element, in accordance with the present invention, a memory block including the data storage elements, a memory stack including the the data storage elements, and a multiplexer including the data storage elements, will now be described by way of example only and, with reference to the accompanying drawings, in which.

Figure 1:
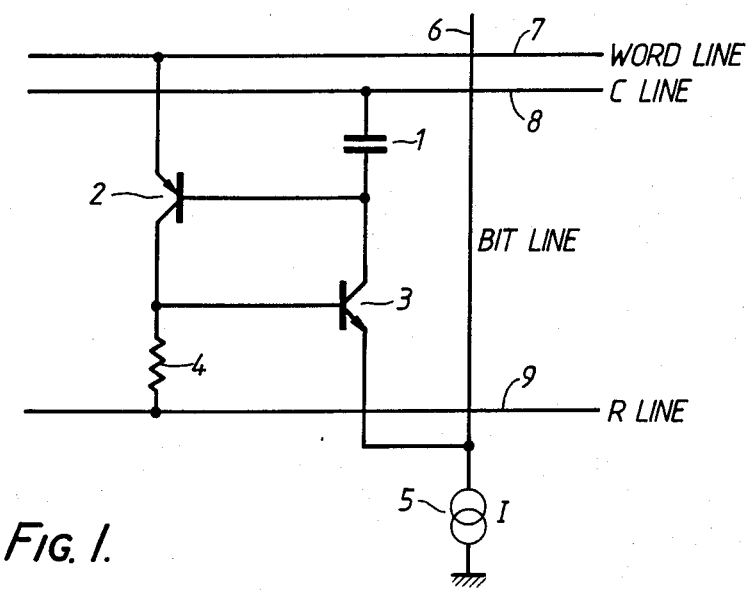
FIG. 1 is a circuit diagram representation of a basic form of data storage element in accordance with the present invention.
Figure 4:
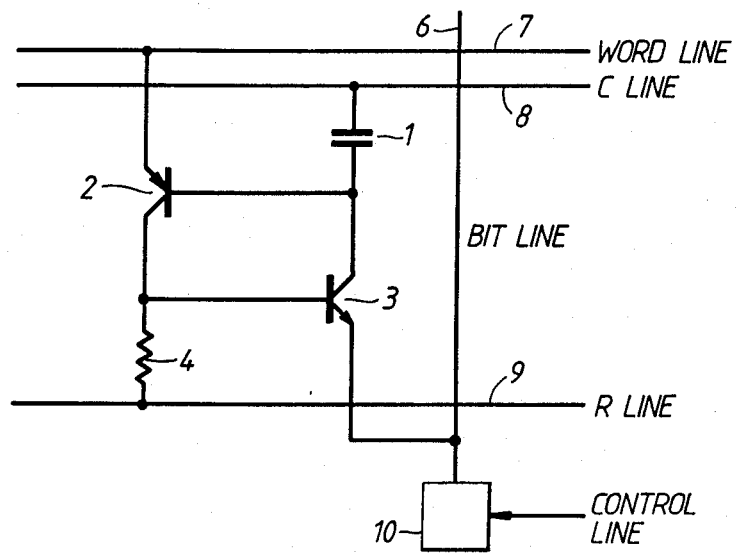
FIG. 4 is a circuit diagram representation of a more practical form of the data storage element.
Figures 5A, 5B:
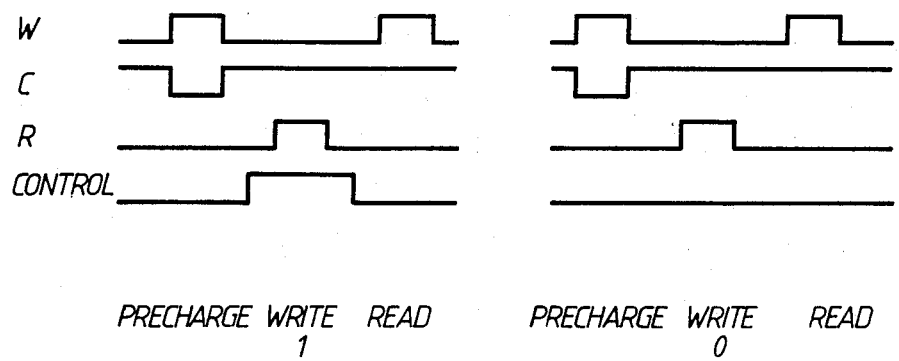
Figure 6:
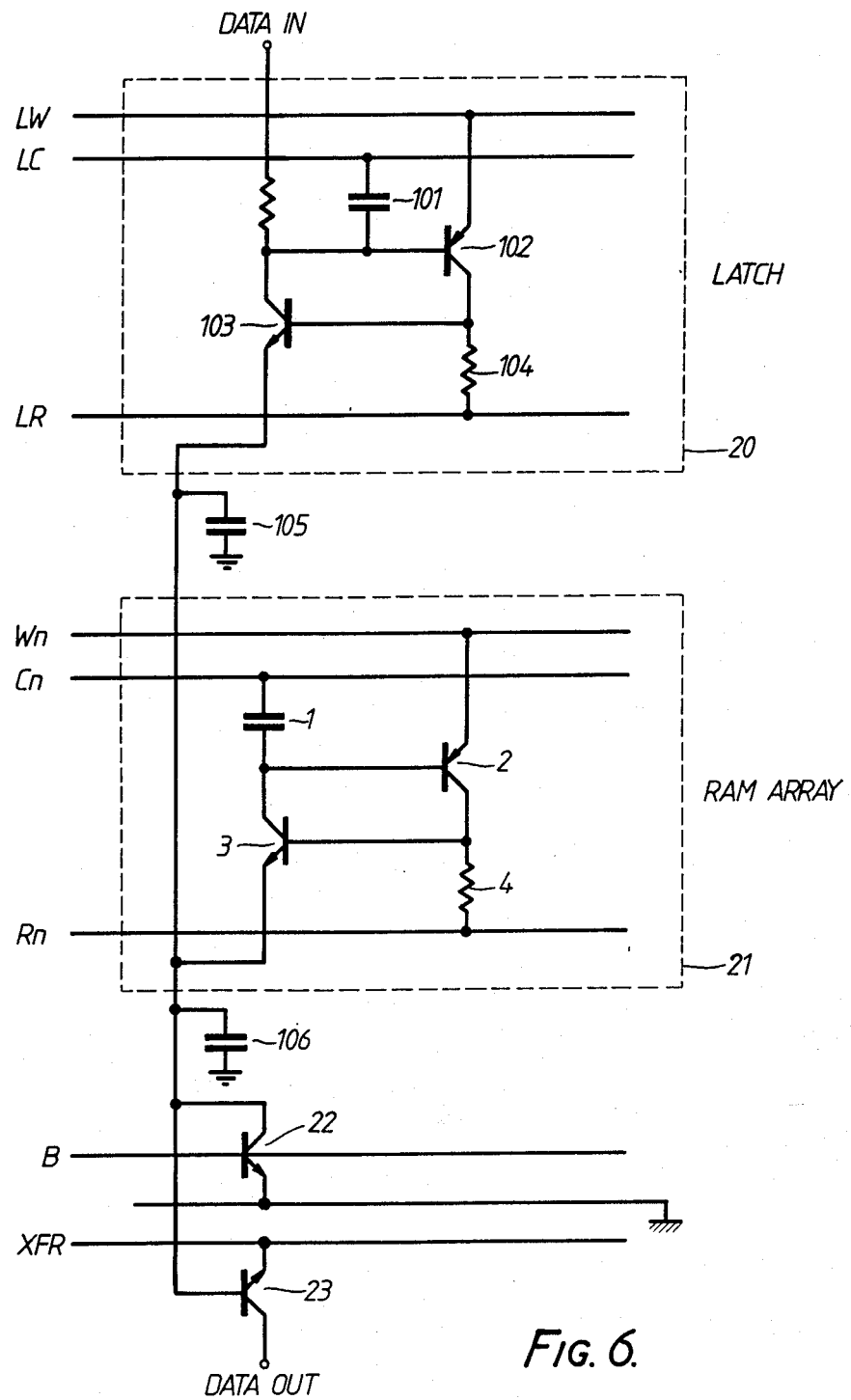
Figure 7A:
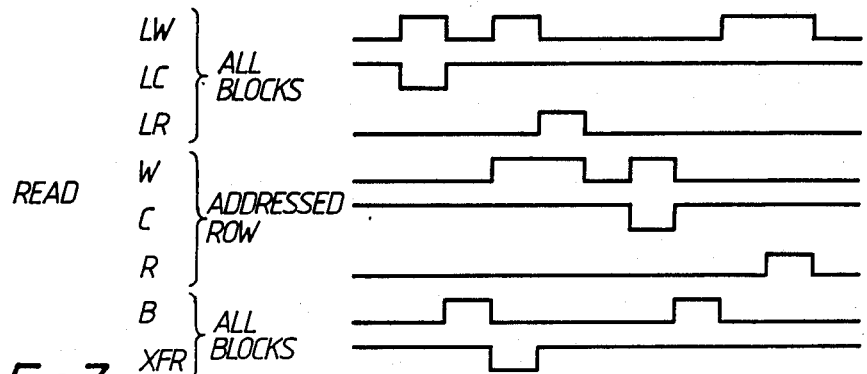
Figure 7B:
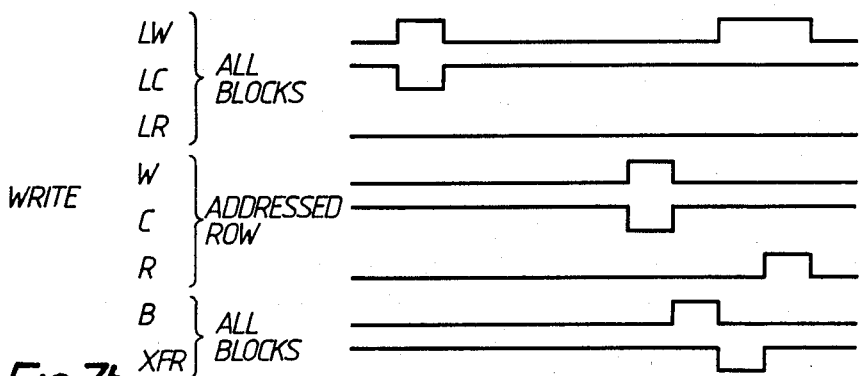
Figure 7C:
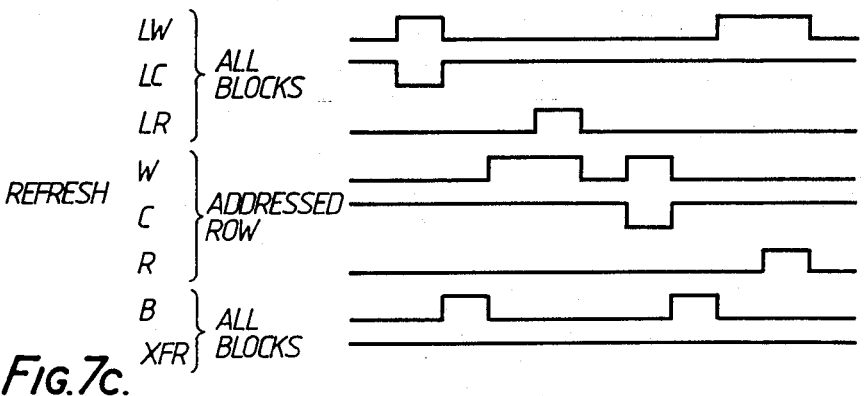
Figure 8:
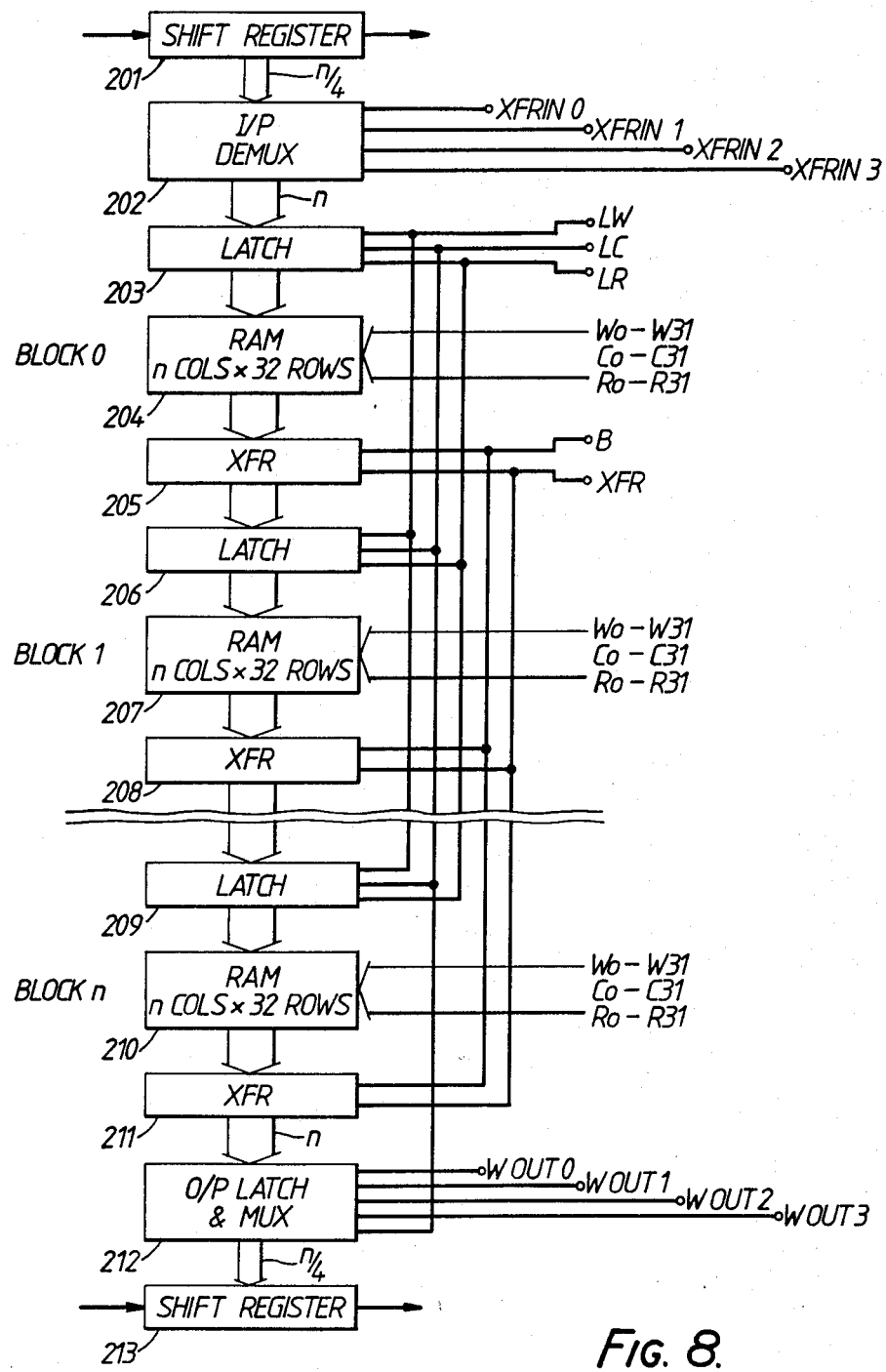
Figure 9:
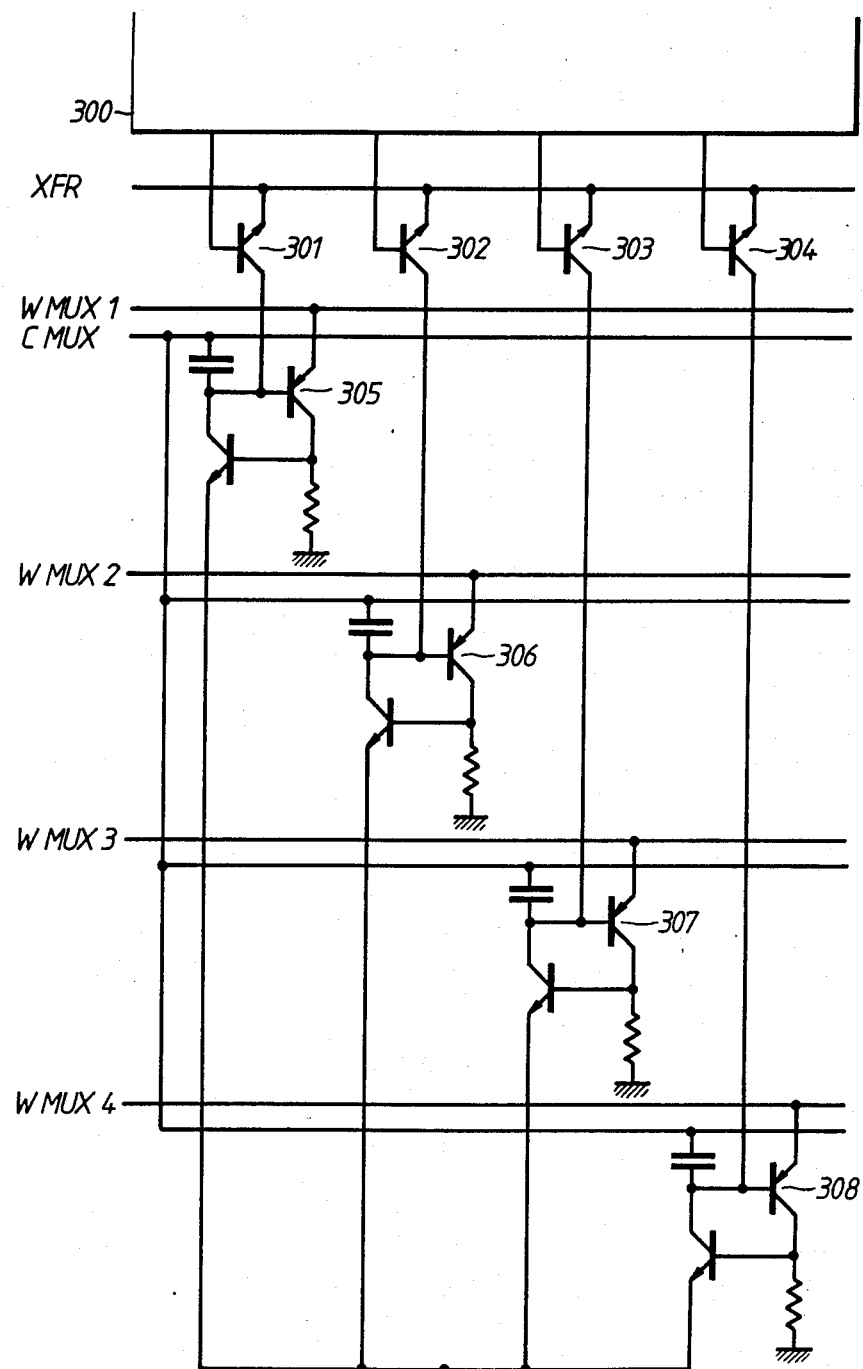
Figure 10:
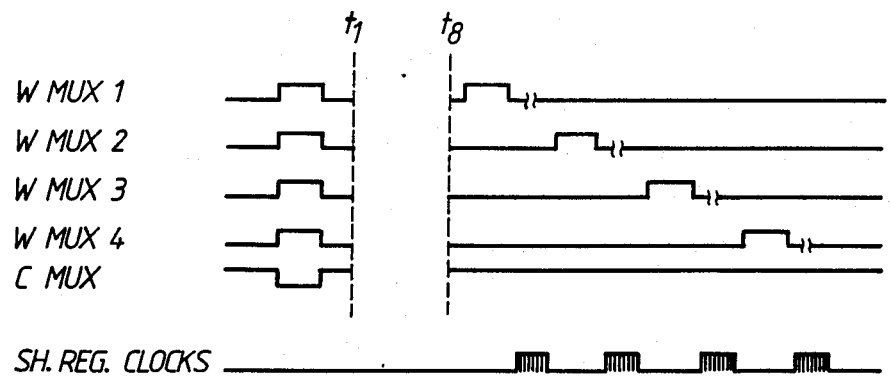

FIGS. 5a, and 5b are timing diagram representations for the operation of the element of FIG. 4;

FIG. 6 is a circuit diagram representation of a block arrangement of a first data storage element, and a second data storage element representative of a plurality of further data storage elements connected to the first data storage element, permitting through data flow and localised data refresh;

FIGS. 7a, 7b and 7c are timing diagram representations of the operational conditions for the data storage block arrangement of FIG. 6;

FIG. 8 is a diagrammatic representation of groups of data storage blocks arranged to provide a memory stack with input demultiplexers and output multiplexers;

FIG. 9 is a circuit diagram representation of a transfer gate and output multiplexers included in FIG. 8;

FIG. 10 is a timing diagram representation of the operational conditions of column memory and the multiplexers, FIGS. 11a, 11b, and 11c represent, respectively, a see-through plan view, a sectional view along a line Y—Y of FIG. 11a, and a sectional view along a line X—X of FIG. 11a, of a monolithic semiconductor structure for the arrangement of FIG. 1.

Figure 12:
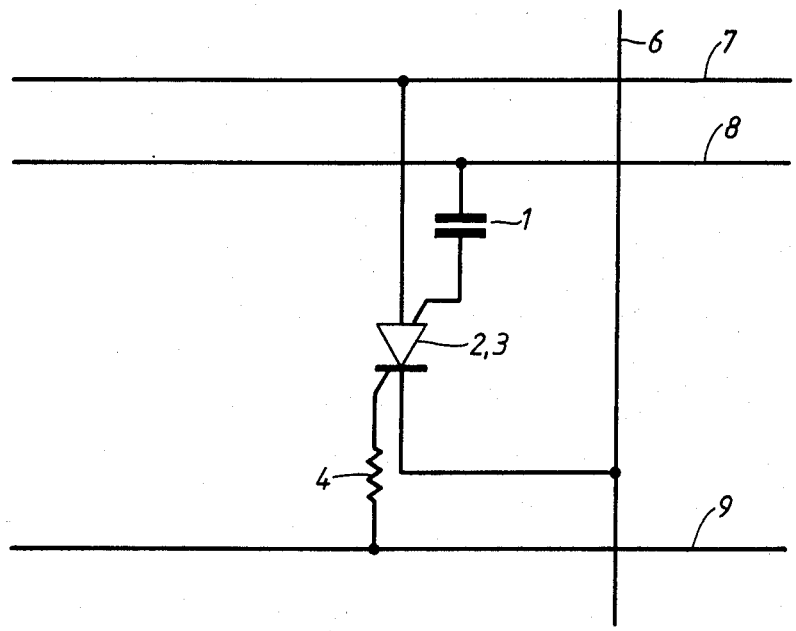
Figure 13:
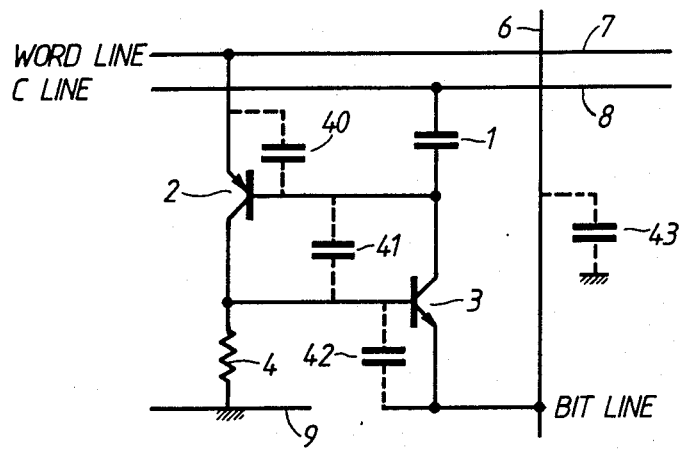
Figure 14:
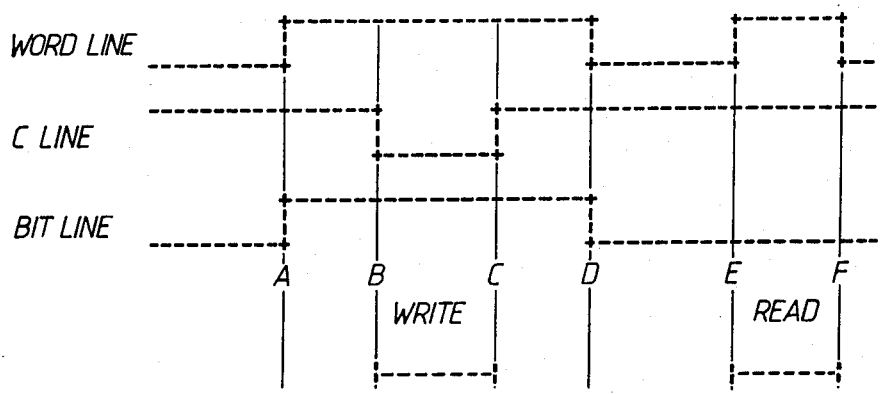
Figure 15:
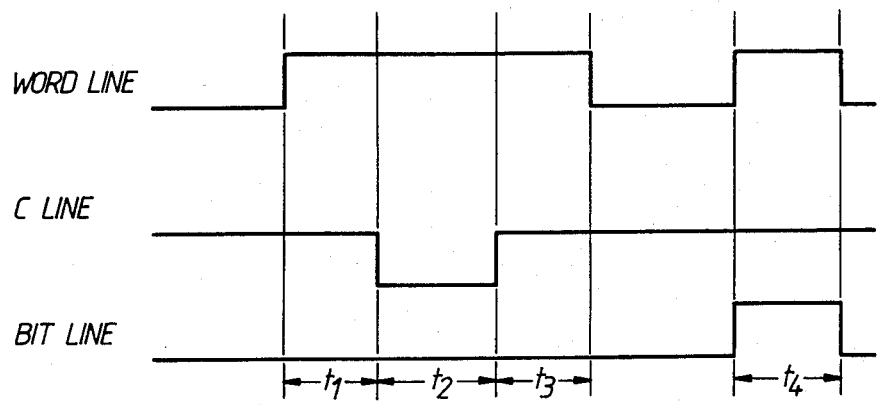
Figure 16:
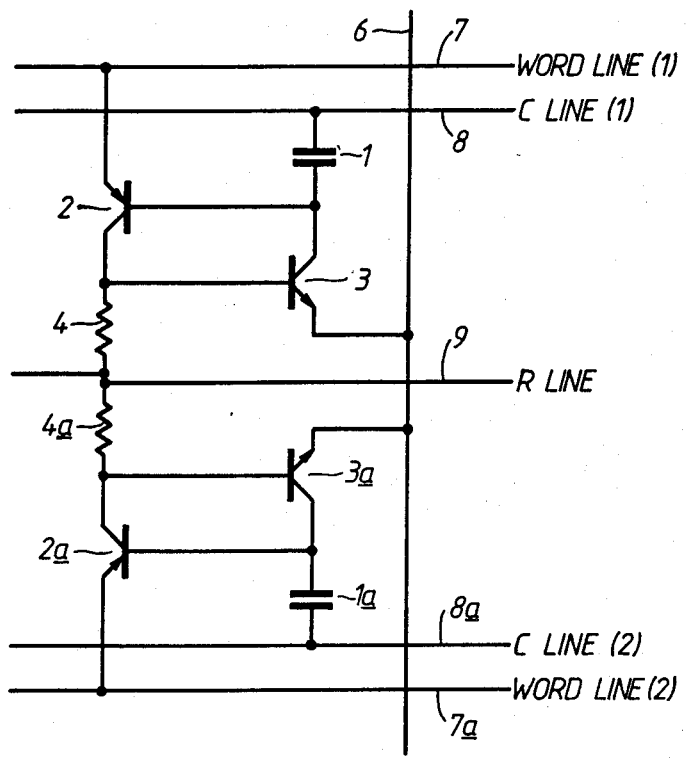
Figure 17:
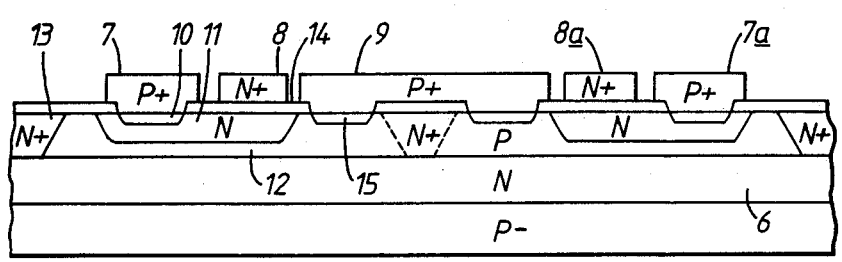
Figure 18:
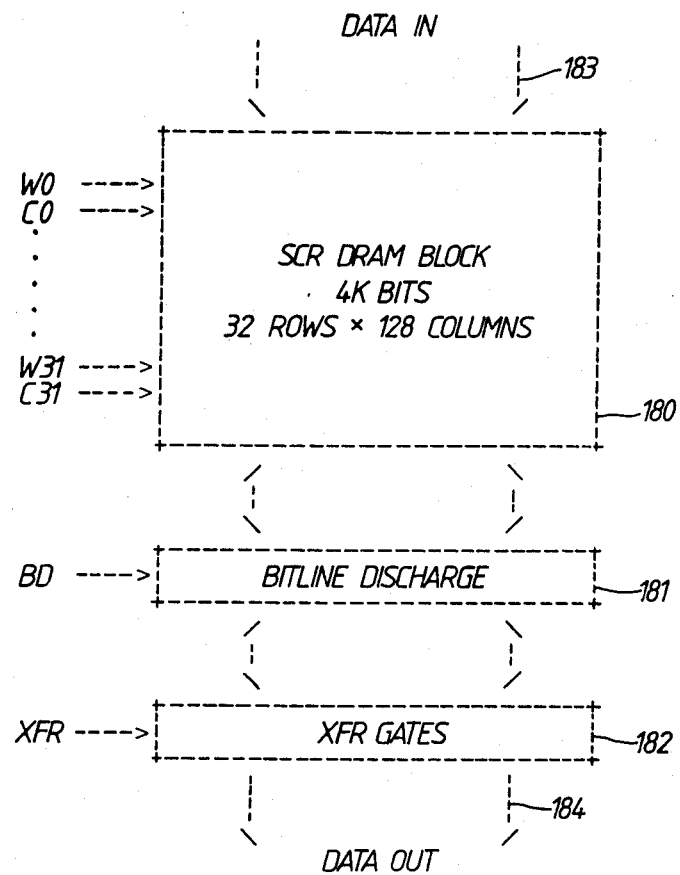
Figure 19:
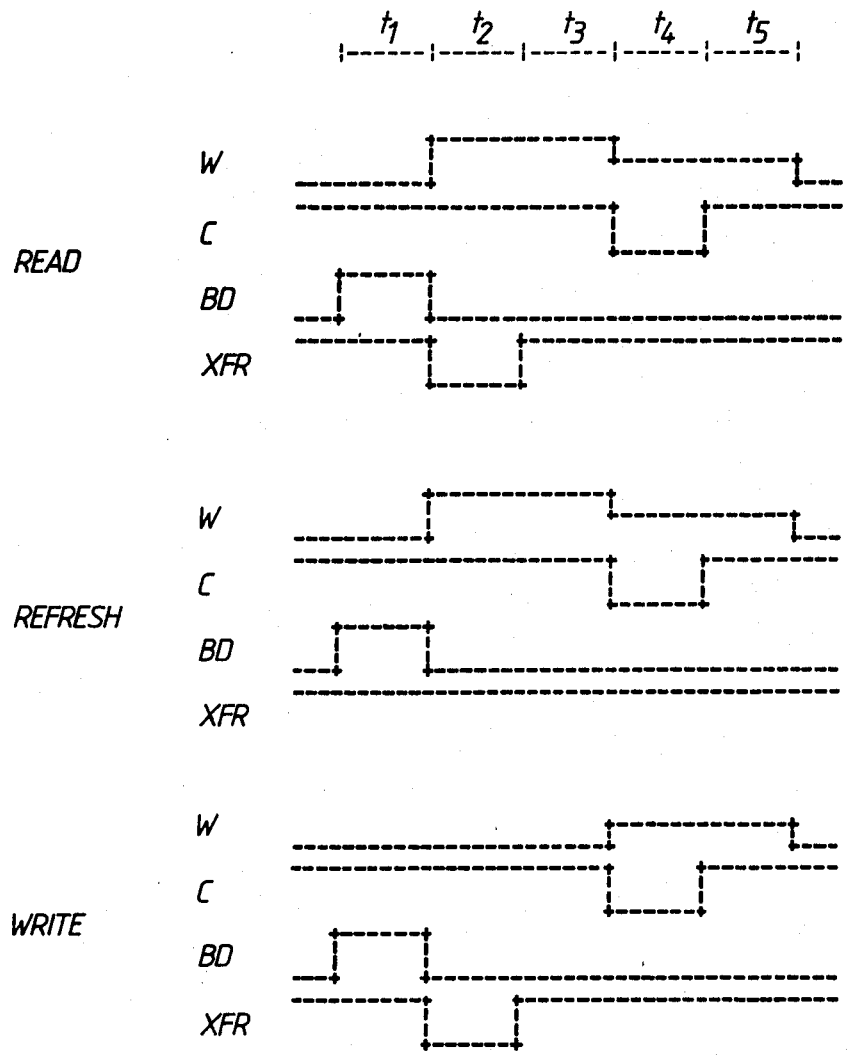
Figure 20:
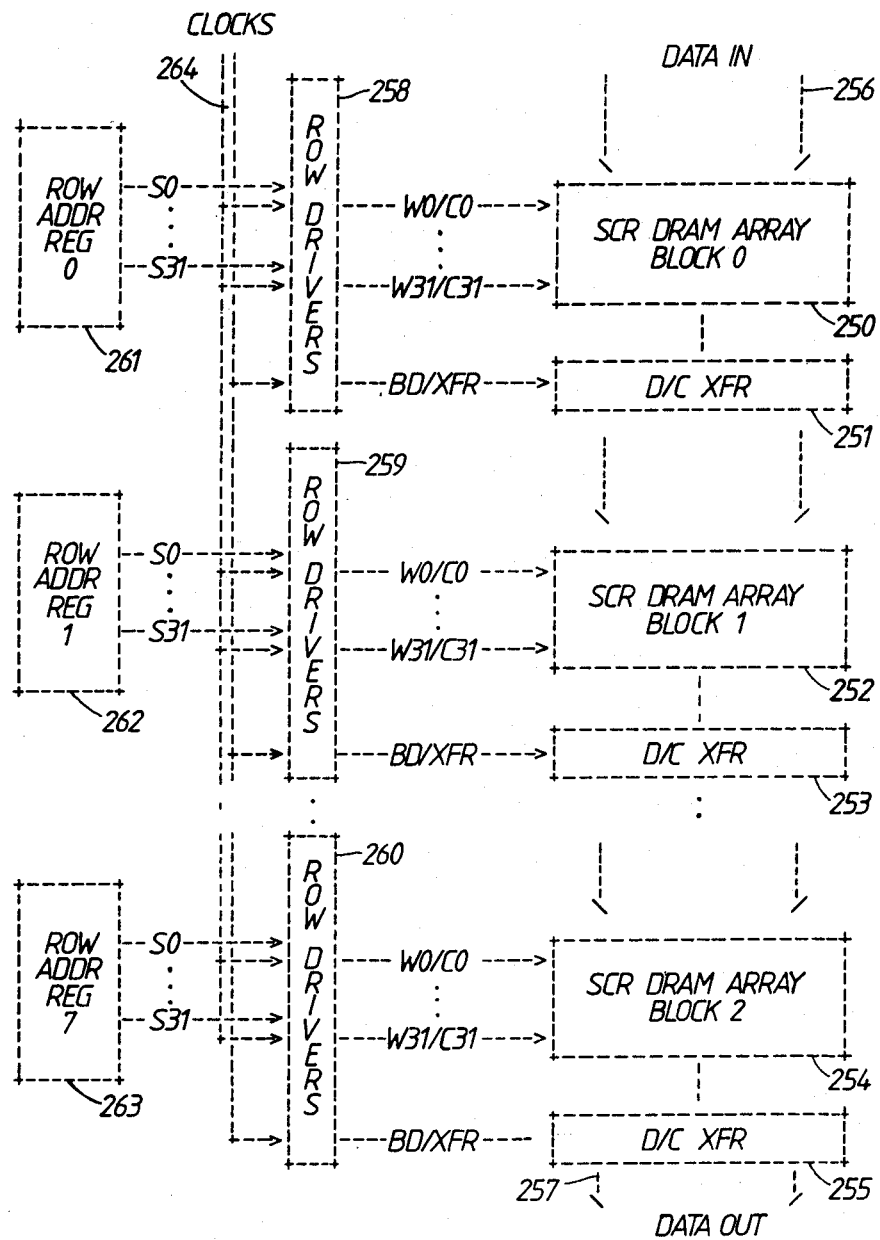
Figure 21:
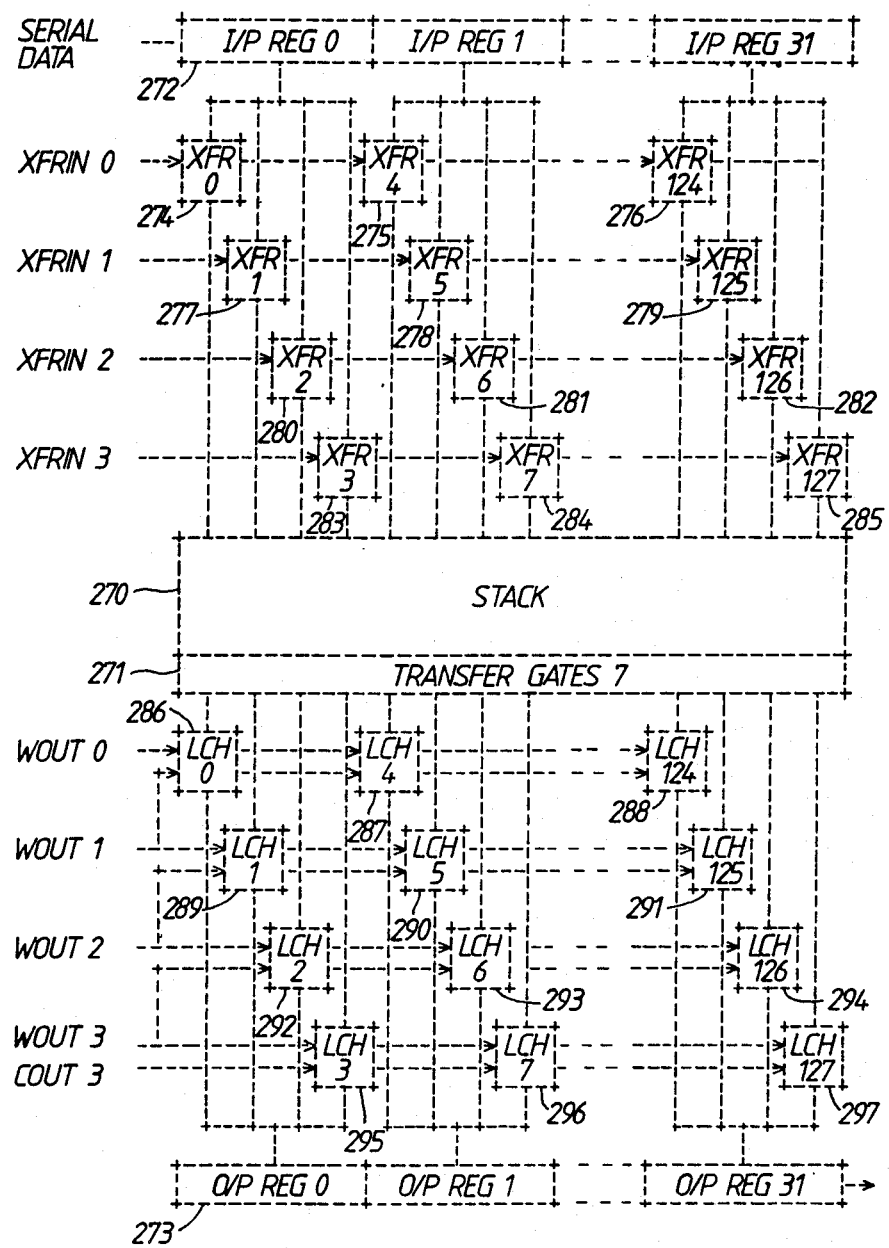
Figure 23:
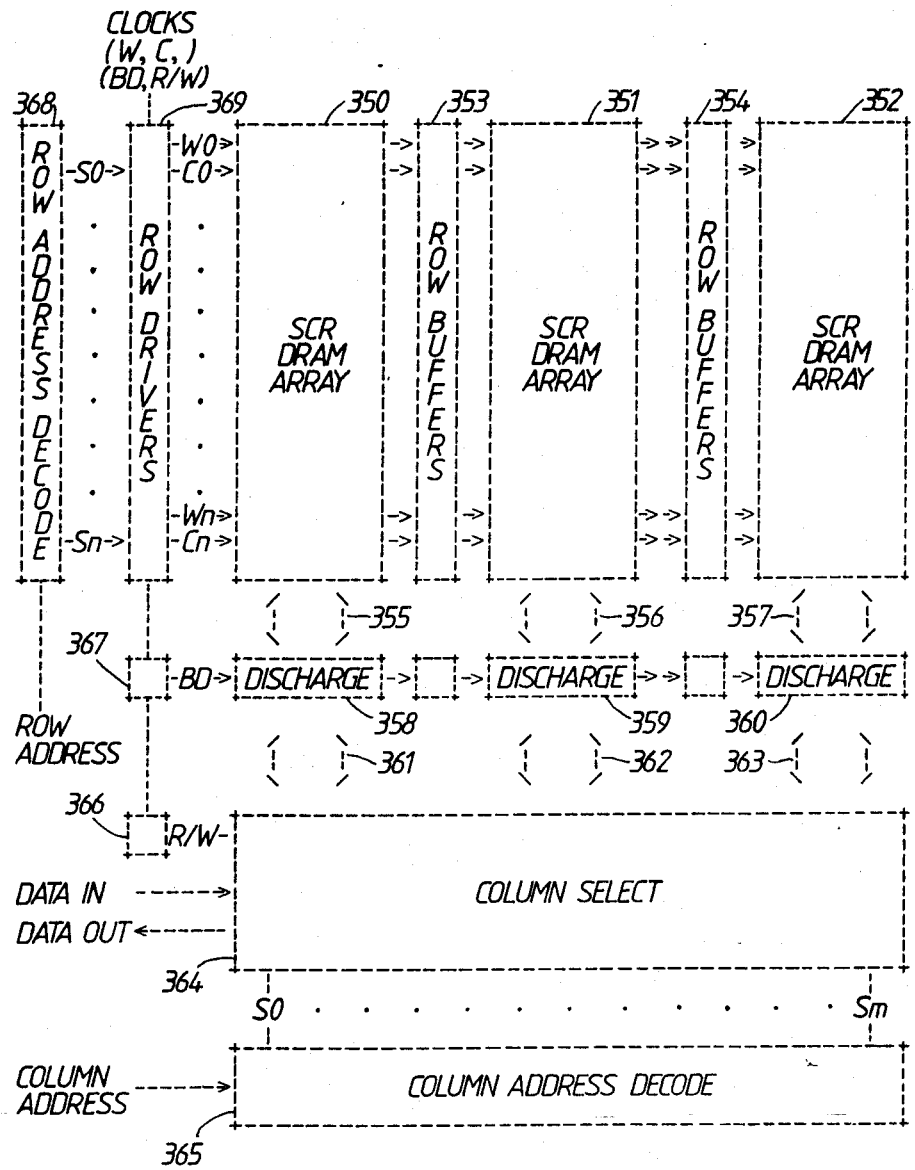
Figure 24:
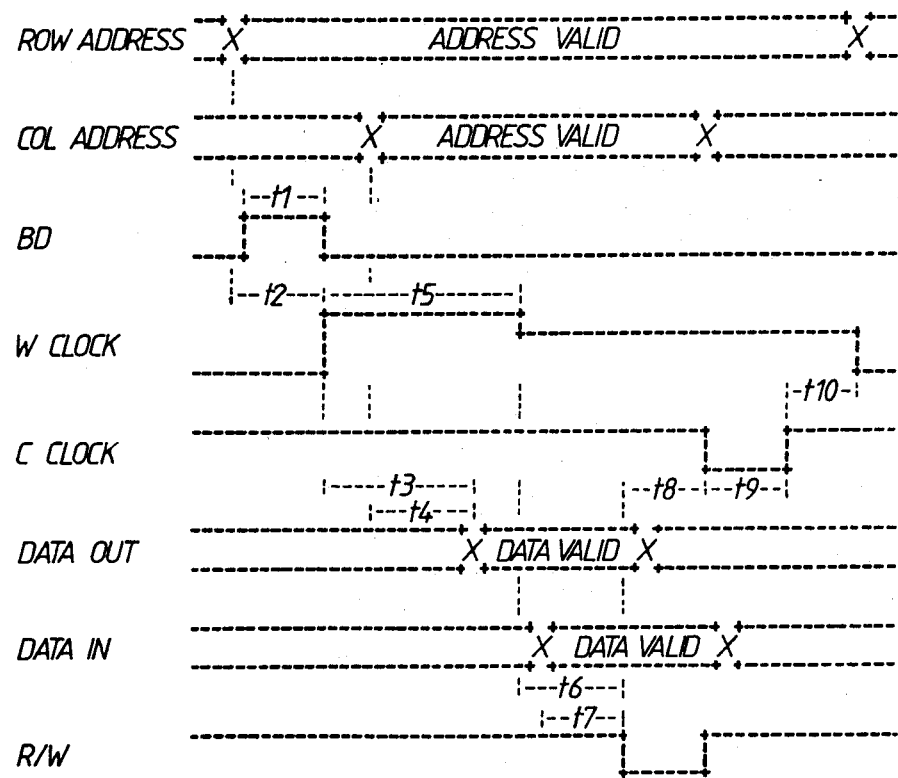
Figure 25:
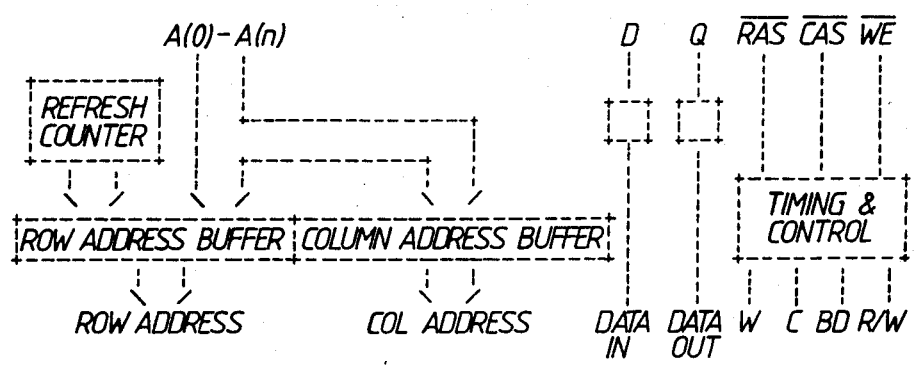
Figure 26:
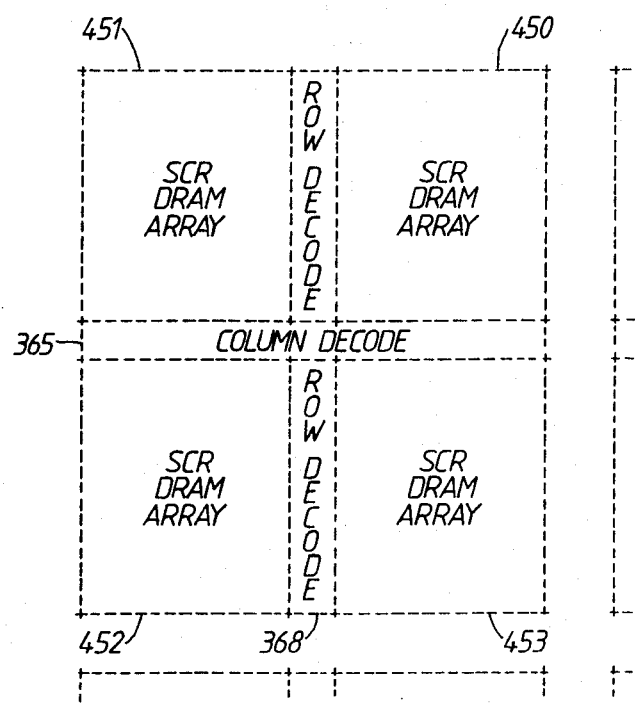
Figure 27:
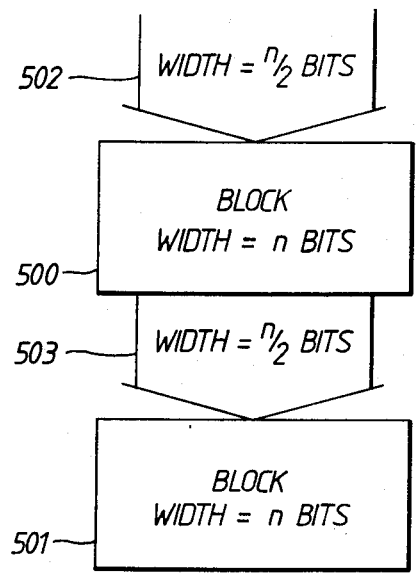
Figure 28:
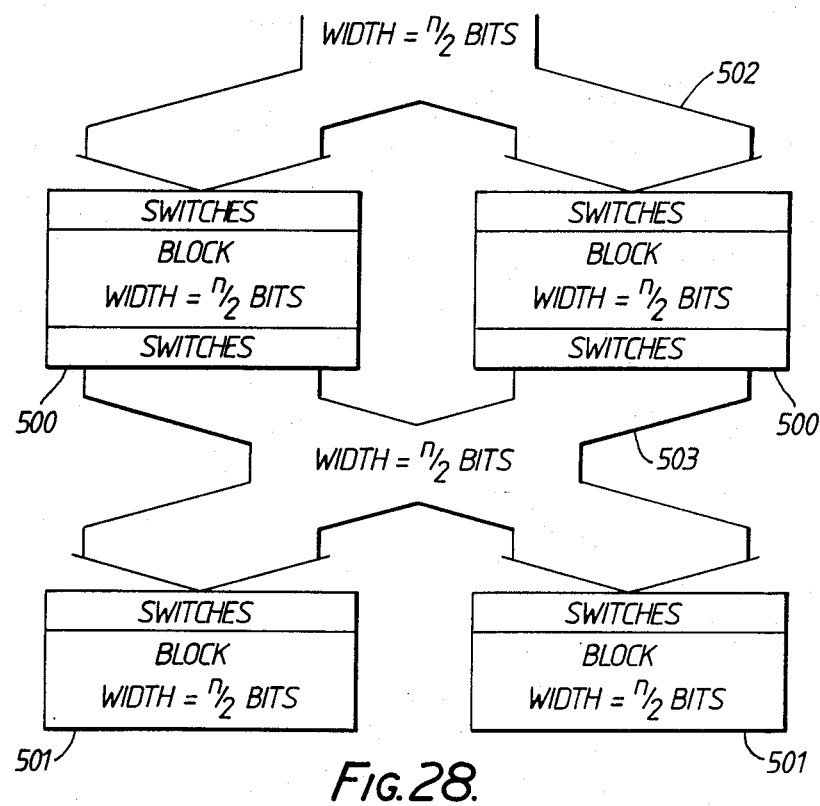
Figure 29:
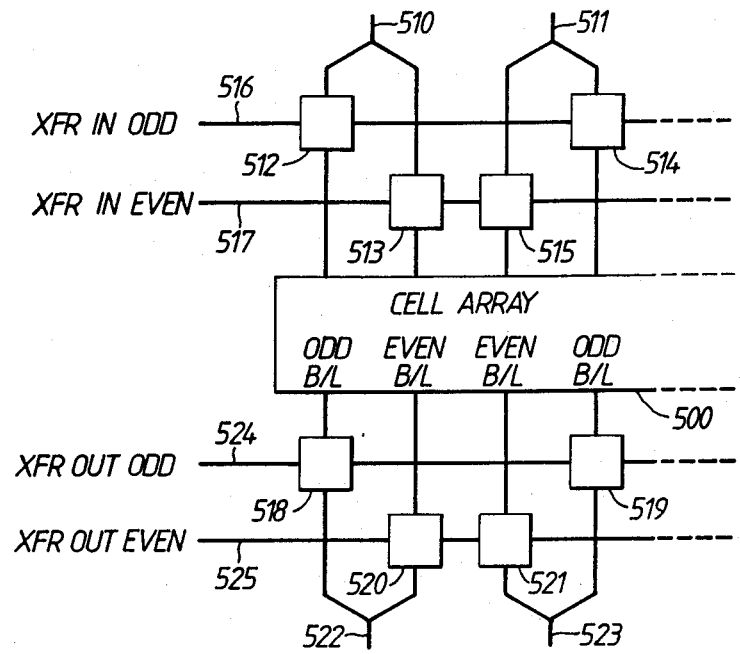
Figure 30:
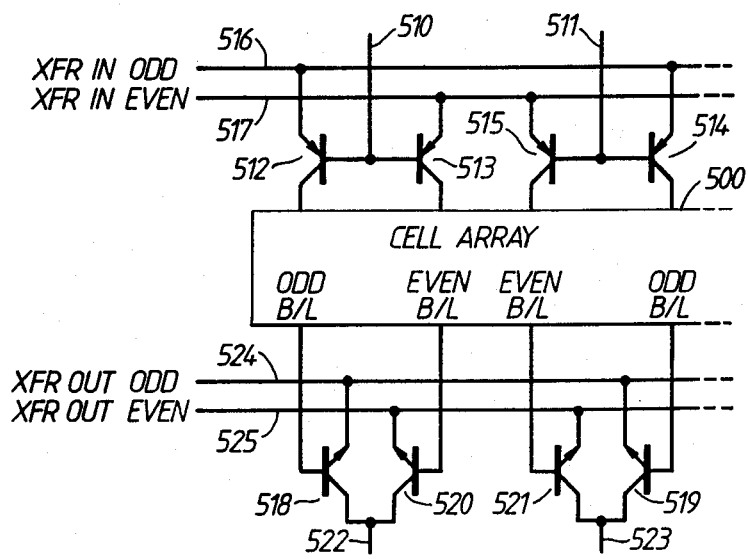

FIG. 12 is an alternative circuit diagram representation of the data storage element of FIG. 1, FIG. 13 is a circuit diagram representation of a modified form of the data storage element of FIG. 1, FIG. 14 is a timing diagram representation of the operational conditions of the data storage element of FIG. 13, FIG. 15 is an additional timing diagram representation of the operational conditions of the data storage element of FIG. 13, FIG. 16 is a circuit diagram representation of two of the data storage elements of FIG. 13, FIG. 16 is a circuit diagram representation of two of the data storage elements of FIG. 13 in a back-to-back arrangement, FIG. 17 is a sectional view representation of the monolithic form of the two data storage elements of FIG. 16, FIG. 18 is a schematic representation of a memory block based on the data storage element of FIG. 13, FIG. 19 is a timing diagram representation of the operational conditions of the memory block of FIG. 18, FIG. 20 is a schematic representation of a memory stack built up of the memory blocks of FIG. 18, FIG. 21 is a schematic representation of the input and output ports of the memory stack of FIG. 20, FIG. 22 is a timing diagram representation of the operation of the input and output ports of FIG. 21, FIG. 23 is a schematic representation of a row and column addressable memory arrangement built up of the memory blocks of FIG. 18, FIG. 24 is a timing diagram representation of the operation of the row and column addressable memory of FIG. 23, FIG. 25 is a schematic representation of the row and column addressable memory of FIG. 23 along with the necessary control signals, FIG. 26 is a schematic representation of an arrangement of four of the row and column addressable memories of FIG. 23 with shared row and column decoders, FIG. 27 is a schematic representation of a memory stack consisting of two memory blocks which have interleaved data storage elements, FIG. 28 is a more detailed representation of FIG. 27, FIG. 29 is a more detailed representation of part of FIG. 28, and FIG. 30 is a circuit element representation of FIG. 29.

Referring to FIG. 1, a data storage element includes a capacitor 1 having one plate connected to a first transversely extending conductor 8 (the C line). The other plate of the capacitor 1 is connected to the collector electrode of an NPN bipolar transistor 3 and to the base electrode of a PNP transistor 2. The emitter electrode of the PNP transistor 2 is connected to a second transversely extending conductor 7 (the WORD line) and the collector electrode of the transistor 2 is connected, by way of a resistor 4, to a third transversely extending conductor 9 (the R line). The base electrode of the NPN transistor 3 is connected to the collector electrode of the PNP transistor 2 and the emitter electrode of the NPN transistor 3 is connected to a longitudinally extending conductor 6 (the BIT line). A current source 5 connects the BIT line to a reference voltage level.

Referring to FIG. 1, the inclusion of the C line 8, and the connection of one terminal of the capacitor 1 to the C line 8, provides an arrangement in which the voltage level of the terminal of the capacitor 1 connected to the C line 8 is controllable, as explained below with reference to FIG. 2, to enhance noise immunity. The arrangement referred to is also suitable for low-voltage, hence low-power, operation.

In the arrangement of FIG. 1, a further enhancement to the noise immunity is provided by the resistor 4 which shunts the base-emitter circuit of the NPN transistor 3 and through which the base voltage level of the NPN transistor 3 is clamped, by means of the R line 9, to set voltage levels. In addition, the connection of the R line 9 to the base electrode of the NPN transistor 3 by way of the resistor 4 facilitates control of the operation of the transistor 3 for executing the WRITE operation, as described below with reference to FIG. 2.

In the arrangement of FIG. 1, the charge on the capacitor 1 will be such as to render the transistors 2 and 3 non-conductive for one state of the cell, representing a logical zero, or such as to render the transistors 2 and 3 conductive for the other state of the cell, representing a logical one, on the application of a positive voltage to the WORD line 7. The state of the cell is sensed by noting whether or not the voltage level of the BIT line 6 rises with that the WORD line 7. The voltage applied to the WORD line 7 to read the cell need only be of the order of 1.5V, which represents very low power operation of the cell. In practice, the function of the current source 5 will be performed by the capacitance associated with the BIT line 6, and the current drawn during cell sensing will be the charge current drawn in charging the BIT line capacitance to the drive voltage. The output signal from the cell is a d.c. level, independent of the charge capacity of the storage capacitor 1, which d.c. level is set and sustained by the signal applied to the WORD line 7, and no sense amplifiers are required. The sense function is performed within the cell and is not subject to noise or threshold level variations associated with a charge-amplifier sensing system. The "write" level and the "sense" threshold are both determined by the components making up the cell and are therefore consistent with each other, avoiding the need for level shifting in the operation of the cell. The WORD line 7 is grounded while the cell is in the quiescent state and therefore noise spikes and other disturbances are prevented from reaching and possibly triggering, the transistors 2 and 3, when the cell is in the quiescent state. Although it is not shown in FIG. 1, there will be some parasitic collector-to-base capacitance evident in the NPN transistor 3, and, since one plate of the capacitor 1 is connected to the collector electrode of the NPN transistor 3, the parasitic collector-to-base capacitance will increase the effective storage capacitance for the cell, permitting the capacitor 1 to be of reduced value (and therefore occupy less area) in comparison with a cell arrangement in which the parasitic capacitance referred to, does not contribute to storage capacity.

Figure 3:
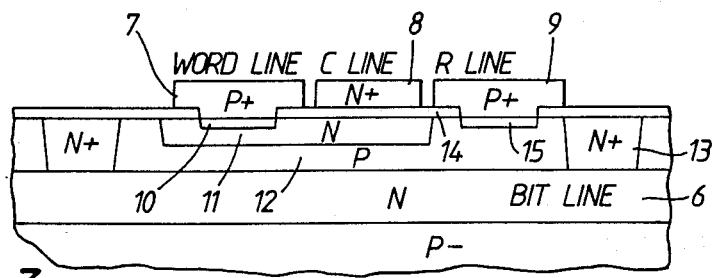
FIG. 3 is a diagrammatic sectional representation of a monolithic semiconductor structure providing the circuit arrangement of FIG. 1.

Referring to FIG. 3, a monolithic semiconductor structure providing the circuit arrangement of FIG. 1 includes a longitudinally extending bar 6 of N type silicon material (the BIT line) above which lies a bar of P type silicon material 12, above which, in turn, lies a bar of N type silicon material 11 displaced towards one side of the P type bar 12. A layer 14 of silicon nitride covers the control region of the upper surface of the N type bar 11 and extends to part of the upper surface of the P type bar 12. A first transversely extending bar 8 of N+ type silicon material (the C line) extends over the silicon nitride layer 14 lying over the N type silicon bar 11, a second transversely extending bar 7 of P+ type silicon material (the WORD line) makes contact along the N type silicon bar 11 and creates a doped region 10 in the region 11, and a third transversely extending bar 9 of P+ type silicon material (the R line) makes contact along the P type silicon bar 12 and creates a doped region 15 in the region 12. The bar 12 is terminated by an N+ type silicon barrier and the entire structure described above is formed on a P- type silicon substrate.

Referring still to FIG. 3, the transversely extending N+ silicon bar 8 may be replaced by a P+ silicon bar or a metal bar. The transversely extending P+ silicon bar 7 may be replaced by a metal bar and the doped emitter region 10 produced by ion implantation. The transversely extending bar 9 may also be replaced by a metal bar and ion implantation used to provide the doped region 15.

In the structure represented by FIG. 3, the regions 11, 12 and 6 together form a vertical NPN transistor and the regions 10, 11 and 12 together form a vertical PNP transistor, the two transistors bearing to each other the relationship of the transistors 2 and 3 of FIG. 1. The silicon nitride layer 14 forms the dielectric of a capacitor having the regions 8 and 11 as its plate electrodes, the capacitor being connected to the remainder of the circuit as shown for the capacitor 1 of FIG. 1. The resistor 4 is provided mainly by the silicon bulk material within the region 12 but lying between the region 15 and the part of the region active as the base electrode of the transistor 3 and the collector electrode of the transistor 2.

In the arrangement represented by FIG. 3, the three-dimensional stacking of the active devices yields a compact cell occupying only some 65% of the area required for current 256 K MOS cells. Also, the arrangement of the storage capacitor in relation to the parasitic collector-to-base capacitance of the NPN transistor structure yields a storage capacity equivalent to that of current 256 K MOS cells in a smaller area.

The arrangement represented by FIG. 3 provides an inverted NPN transistor structure with a buried N-type emitter region 6, a uniformly doped epitaxial base region 12 with a polysilicon doped base contact, and a polysilicon doped collector which doubles as the N-type base region for the PNP transistor. The inverted NPN transistor structure is such that there should be a high injection of holes into the emitter region from the base region contact due to the P+/P/N structure, leading to poor emitter efficiency and low gain. The situation is altered by the presence of the resistive path between the region 15 and the active region of the NPN structure 11/12/6 which acts against the region under the resistor contact becoming forward biassed with the result that there is no hole injection into the emitter and the NPN transistor exhibits high gain, as does the PNP transistor (which is not inverted). The resistive path referred to above is generally similar to the structure of a junction field effect transistor in which the regions 11 and 6 form gate electrodes and the region 12 forms the channel, conduction along the channel taking place under pinchoff. The combined PNP/NPN structure forms an efficient thyristor switch.

The regions of the monolithic structure represented by FIG. 3 most susceptible to ionising radiation which would generate soft data errors are shielded from external radiation by other less sensitive regions of the cell. Additionally, the buried BIT line arrangement provides a screen for the remainder of the cell from carriers in the substrate P− material, and the arrangement of sensing the state of the cell from within provides almost total immunity to alpha particle hits on the BIT line 6.

Figure 2:
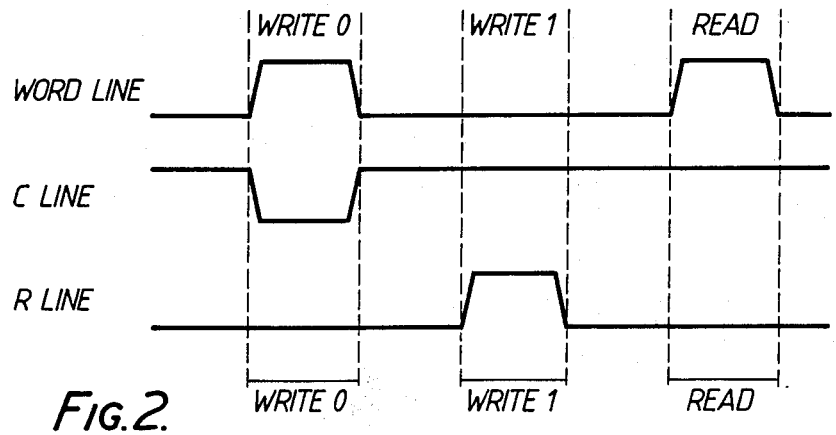
FIG. 2 is a timing diagram representation of the operational conditions for the data storage element of FIG. 1.

The data storage element represented by the circuit arrangement of FIG. 1 and the monolithic structure of FIG. 3 is operated as follows as illustrated by FIG. 2:

1. Writing of a logical "0" to the cell

The WORD line voltage is raised from zero to a positive value, the C line voltage is taken from a positive value down to zero, the R line voltage is held at zero. The BIT line voltage is not controlled. The effect of applying the conditions listed above is that the capacitor 1 will be charged to the positive voltage of the WORD line less the voltage loss due to the baseemitter voltage drop at the transistor 2. The WORD line voltage is subsequently returned to zero and the C line voltage returned to the positive value, referred to above, leaving the capacitor 1 charged to a voltage of nearly twice the positive voltage excursion of either the WORD line or the C line (the voltage excursions being assumed to be equal) with the plate connected to the transistors 2 and 3 being positively charged.

2. Writing of a logical "1" to the cell

The BIT line curent sink is activated, the WORD line voltage is maintained at zero, the C line voltage is maintained at a positive value, and the R line voltage is raised to a positive value.

The combined effect of the conditions listed is that the transistor 3 will be caused to conduct, holding the plate of the capacitor 1 connected to the transistor 3 at a voltage equal to the voltage at R less the forward-biassed base to collector voltage of the saturated transistor 3, the plate of the capacitor 1 connected to the C line being held at a positive voltage. In due course the R line voltage returns to zero volts leaving the capacitor 1 with the plate connected to the transistors 2 and 3 negatively charged with respect to the other plate.

3. Reading the cell

The WORD line voltage is raised from zero to a positive value, the C line voltage is maintained at a positive value, and the R line voltage is held at zero. Where the charge condition of the capacitor 1 represents a stored logical "1", the base-emitter junction of the transistor 2 will become forward biassed, making it conductive, and causing it to make conductive the base-emitter junction of the transistor 3. The two transistors 2 and 3 are connected as a regenerative switch and hold each other in a conductive state to connect the WORD line to the BIT line. Since the WORD line is held at a positive voltage, the voltage level at the BIT line will indicate what is stored in the cell.

Where the charge condition of the capacitor 1 represents a stored logical "0", the transistors 2 and 3 remain nonconductive and the voltage level of the BIT line will again provide an indication of what is stored in the cell by the switch state.

Control of the BIT line, referred to above, is effected by the arrangement illustrated by FIG. 4, in which a controllable current sink 10 is activated by a control voltage when it is required to provide specific conditions at the BIT line. In practice, the function of the controllable current sink 10 is performed by the BIT line capacitance which is discharged and used as a current sink when a low voltage condition is required at the BIT line.

FIGS. 5a and 5b illustrate, respectively, a precharge/write zero/read and a precharge/write one/read sequence for the arrangement of FIG. 4.

Referring to FIG. 5a, the capacitor 1 is provided with a set charge by activating the WORD line positively and the C line negatively, as shown, while leaving the current sink 10 deactivated (control voltage zero). The current sink 10 is then activated (control voltage high) and the voltage level of the R line is raised, causing the transistor 3 to become conductive and to discharge the capacitor 1 into the current sink 10, writing a logical "1" into the cell. When the cell is read by raising the voltage level of the W line, the transistors 2 and 3 will switch on to indicate that the cell holds a logical "1".

Referring to FIG. 5b, the capacitor 1 is again provided with a set charge by activating the W and C lines, as shown, and this time the current sink 10 remains deactivated when the R line voltage level is raised, these conditions leaving the charge on the capacitor 1 unchanged. When the cell is read by raising the voltage level of the W line the transistors 2 and 3 will remain non-conductive to indicate that the cell holds a logical "0".

The effect of the current sink, as illustrated in FIGS. 5a and 5b, is used to selectively load data into an array of the memory cells one row at a time. In the loading of data into one row in an array of the memory cells, the selected row is first loaded with "0" by energising WORD, C and R lines (BIT lines with current sinks deactivated) as illustrated for "WRITE 0" in FIG. 5b, which results in all the memory cells in the row being loaded with "0". The memory cells in the row which are to be loaded with "1" are then selectively energised by activating the current sinks of appropriate BIT lines of the memory cells which are to receive a "1" and energising the WORD, C, and R lines of the selected row as illustrated for WRITE 1 in FIG. 5a, which results in the selected memory cells being loaded with "1".

Reading data from the memory cell represented by FIG. 1 or FIG. 4 results in the modification of the stored charge level, resulting in the need for charge level restoration.

Periodic charge level restoration is also required to compensate for charge losses due to leakage.

FIG. 6 represents a memory block structure in which data is stored in a memory cell as represented by FIG. 1, regenerated periodically in the memory cell, and read out from the memory cell. The memory block structure represented by FIG. 6 includes an input latch 20, a representative memory cell 21, a BIT line control device 22, and a transfer gate 23. The BIT line capacitance which acts as the current sink, described above, is represented by capacitors 105 and 106.

Referring to FIG. 6, the memory cell 21 is one of a plurality of cells which are connected to the input latch 20, to the BIT line control device 22, and to the transfer gate 23. The arrangement of the plurality of cells may range between a single-row of blocks with shared W, C and R lines and blocks arranged as a plurality of rows and columns, each row having respective shared W, C and R lines and each column a shared B line, the range including thirty-two blocks in a single row and blocks in 256 rows and 256 columns. In any of the arrangements of the blocks, the transfer gate 23 may lie on the opposite side to the input latch 20, as shown, or it may lie on the same side as the latch 20.

The arrangement of FIG. 6 performs the operations of reading data, writing data, and data refresh, as illustrated by FIGS. 7a, 7b and 7c, respectively.

Referring to FIGS. 6 and 7a, the READ operation is divided into eight steps occupying time periods $t_1$ to $t_8$, as illustrated. The quiescent states of the input ports are LW, LR, W, R, and B, LOW and LC, C, and XFR, HIGH. The following actions take place during the time periods $t_1$ to $t_8$:

$t_1$: The input port LW of latch 20 is held high while its input port LC is held low to precharge the storage capacitor 101 to a fixed voltage level $t_2$: The input port LW of latch 20 is returned low while the input port LC is returned high, leaving the storage capacitor 101 charged to a voltage greater than the positive voltage excursion of the LW port. The B input port controlling the transistor 22 is held high, the effect being to precharge (discharge) the BIT line capacitance (capacitors 105, 106) to zero volts.

$t_3$: The input port LW of latch 20 and input port W of memory cell 21 are held high and the input port XFR is brought low to enable conduction by way of the transistor 23. Thus there may be read out from memory cell 21 a signal representing the stored data according to whether or not the voltage on the capacitor is such as to cause the switching on (and latching) of the transistors 2 and 3 with consequent energisation of the base electrode of the transistor 23. The capacitor 101 remains precharged to a positive voltage and the transistors 102 and 103 do not switch on.

$t_4$: The transfer gate control port XFR is held high to switch off the transfer gate 23. W remains high so that the transistors 2 and 3 remain switched on. LR is held high to cause the data from the cell 21 (represented by the state of the transistor pair 2/3) to be written to the latch 20. The W line is brought low at the end of $t_4$ to switch off the transistors 2 and 3.

$t_5$: The input port W of the cell 21 is held high and the input port C of the cell is brought low to precharge the cell capacitor 1.

$t_6$: The input port B is held high to discharge the BIT line capacitors 105 and 106.

$t_7$: The input port LW of the latch 20 is held high to place the data stored in the latch 20 on the BIT line capacitors 105 and 106.

$t_8$: The input port LW of the latch 20 remains high and the R line of the memory cell 21 is held high to write the data from the latch 20 to the memory cell 21.

The operations occupying the periods $t_5$ to $t_8$ accomplish the refreshing of the memory cell 21 by the use of the latch 20 following a read operation during the periods $t_1$ to $t_4$, as described. The refresh operation involves only components local to the memory cell 21.

Referring to FIG. 7b, writing data into the cell 21 is accomplished by writing the data to the latch 20 and then transferring it to the cell 21. The following actions take place during the periods $t_1$ to $t_8$ of the WRITE operation:

$t_1$: The capacitor 101 is precharged as for the READ operation described above.

Data to be entered is then applied to the DATA IN port of the latch 20 and will so influence the charge on the capacitor 101 that the capacitor charge becomes representative of a logic "1" or logic "0". The capacitor 101 will, in fact, be left in its precharged condition if a logic "0" is applied to the DATA in port of the latch 20 (that is, WRITE "0" and PRECHARGE are the same state), but the charge on the capacitor 101 will be reduced from the precharged level by the application of a logic "1" condition.

$t_2-t_4$: No action $t_5$: The capacitor 1 is precharged as for the READ operation described above.

$t_6$: The B line is held high to discharge the BIT line capacitors 105 and 106.

$t_7$: The XFR line is held low to cause the transistor 23 to conduct and the LW line is held high, transferring data from the latch 20 to the BIT line capacitors 105 and 106.

$t_8$: The LW line is maintained high and the R line is raised high, writing either a logic "1" or a logic "0" to the cell 21 according to whether or not the precharged condition of the capacitor 1 is altered.

The operation of the latch 20 is inverted, with respect to the operation of the cell 21, in that a logic "0" condition of the capacitor 101 (precharge level) will cause latching of the transistors 102 and 103 and a logic "1" condition of the capacitor 101 (charge reduced from precharge level) will not cause latching of the transistors 102 and 103.

A REFRESH operation, as illustrated by FIG. 7c, is performed periodically on all cells in order to refresh those memory cells which have not been subjected to a READ operation (which is terminated by a REFRESH operation). The following actions take place during the periods $t_1$ to $t_8$ of the REFRESH operation:

$t_1$: The capacitor 101 of the latch 20 is precharged, as described above.

$t_2$: The BIT line capacitors 105 and 106 are discharged, as described above.

$t_3$ and $t_4$: The latch 20 is written to from the cell 21 as described above.

$t_5$: The capacitor 1 of the cell 21 is precharged, as described above.

$t_6$: The BIT line capacitors 105 and 106 are discharged.

$t_7$ and $t_8$: The cell 21 is written to from the latch 20.

Referring to FIG. 6, the application of a low signal level to the DATA IN port of the latch 20 will switch on the transistor pair 102/103 and a low level signal will appear at the DATA OUT port of the transfer gate transistor 23, there having been an effective transfer of the signal from the DATA IN to the DATA OUT port. The arrangement represented by FIG. 6 therefore permits either the loading of data into the memory cell 21, as described under the WRITE operation, or, by leaving the memory cell 21 inoperative, the through passage of logic "1" data.

The "transparent action" behaviour of the memory block structure of FIG. 6, referred to above, permits the stacking of a plurality of memory block structures to give the stack arrangement represented by FIG. 8.

In FIG. 8, the column blocked structure, referred to, including latches 203, 206 and 209, memory blocks 204, 207, and 210, and transfer gates 205, 208 and 211, which are positioned between, at the top, a demultiplexer 202, and, at the bottom, a multiplexer and latch 212. An upper shift register 201 is arranged to accept serial information and to provide parallel information to the demultiplexer 202 and a lower shift register 213 is arranged to receive parallel data from the multiplexer 212 and to provide serial output data.

Referring to FIG. 8, each of the memory blocks 204, 207, and 210 includes thirty two memory cells which share the latch associated with the block. The latches 203, 206, and 207 have all input ports LW connected together, all input ports LC connected together, and all input ports LR connected together. The memory block 204 has a separate W port, C port, and R port for each constituent row of memory cells. The memory blocks 207 and 210 are arranged similarly to the memory block 204. The transfer gates 205, 208 and 211 have their XFR ports all connected together and their B ports all connected together. The demultiplexer 202 has four control ports XFRIN 0, XFRIN 1, XFRIN 2 and XFRIN 3, and the multiplexer 212 has four control ports WOUT0, WOUT1, WOUT2, and WOUT3.

In the operation of the memory stack structure represented by FIG. 8, data for entry into the memory column is clocked serially through the shift register 201 and is presented in parallel form to the demultiplexer 202 which passes the parallel data downwards into the upper latch 203. Data which is intended for the lower serial memory block 209, 210 211 is passed downwards through the stack from latch to transfer gate until it reaches the lower serial memory block 209, 210 and 211. The transfer of data out of the memory stack takes place through the lower transfer gate 211 to the latch and multiplexer 212 which converts the bit width of the parallel data for parallel to serial conversion in the output shift register 213.

Referring to FIG. 8, the demultiplexer 202 is driven by signals applied to its four control ports XFRO, XFRINI, XFRIN2, and XFRIN3 and the multiplexer 212 is driven by signals applied to its four control ports WOUT0, WOUT1, WOUT2 and WOUT3.

FIG. 9 illustrates the circuit arrangement of the transfer gate 211 and the latch and multiplexer 212 belonging to FIG. 8. The latch and multiplexer referred to, converts the bit-width of parallel data from a parallel-data-output device 300. The output ports of parallel-data-output device 300 are connected to the respective base electrodes of NPN transistors 301, 302, 303 and 304, which are arranged as a parallel data transfer gate and the base electrodes of which are the input ports of the transfer gate. The emitter electrodes of the transistors 301, 302, 303 and 304 are connected together to provide a control input port XFR through which the transfer gate is controlled to permit or block the passage of data from the input to the output ports of the transfer gate. The output ports of the transfer gate are the respective collector electrodes of the transistors 301, 302, 303 and 304. The collector electrodes of the transistors 301, 302, 303 and 304 are connected as data input ports to respective memory cells 305, 306, 307 and 308, each of which has the same circuit configuration as the memory cell of FIG. 1, and which have respective control input ports WMUX1, WMUX2, WMUX3, and WMUX4, and a common control input port CMUX. The output ports of the memory cells 305, 306, 307 and 308 are connected together.

The first step in the operation of the latch and multiplexer illustrated by FIG. 9 is the "precharging" of the storage elements of the memory cells 305, 306, 307 and 308 by holding the common control input port CMUX at a low level while the respective control input ports WMUX1, WMUX2, WMUX3, and WMUX4 are held at a high level. Next, the transfer gates 301, 302, 303 and 304 are opened by holding the input port XFR low, the effect being that the charge on each storage element of the memory cells 305,306,307 and 308 is conditioned to represent the binary data presented to the memory cell. The data is later clocked out of each memory cell in turn by sequentially raising the levels of the respective control input ports WMUX1, WMUX2, WMUX3, and WMUX4 for long enough to effect data output.

FIG. 10 illustrates the waveforms of the control signals required to operate the latch and multiplexer of FIG. 9. The latch and multiplexer control signals are labelled according to the control ports to which they are applied, the labels being WMUX1, WMUX2, WMUX3, WMUX4, CMUX, and XFR. The precharge signals for the latch and multiplexer occur prior to the period covered by FIG. 7, and the control signals occur after the period covered by FIG. 7, represented by the gap between the two groups of signals.

FIGS. 11a, 11b, and 11c illustrate, respectively, a section along a line Y—Y and a section along a line X—X, of an integrated circuit implementation of the memory cell of FIG. 1. FIG. 11b is substantially the same as FIG. 3, and is covered by the description of FIG. 3 with the difference that the N+ region 8 is shown in FIG. 11b as lying partly under the regions 7 and 9 and separated from them by an insulating layer.

FIG. 11a illustrates that the region 6 extends fully across the memory cell structure in the y-direction, say, while the regions 7,8,9,10,11,13 and 15 extend fully across the memory cell in the x-direction. The region 12, alone, is local to the memory cell. The structure illustrated by FIG. 11a permits the fabrication of an array of memory cells in which rows share the region 6 in the y-direction and columns share the regions which extend in the x-direction, providing simplified access to the memory cells and permitting a memory array having the column structure of FIG. 8 repeated, with the rows sharing the LW,LC,LR,W,C,R,B and XFR ports, and employing strings of shift registers at the top and bottom, respectively, for data input and access.

FIG. 11c illustrates that the P+ doped region 10, the region 11, the region 12, and the region 6 are stacked one above the other and confined on each side by a silicon dioxide wall 16.

The array of memory cells, described above, may occupy an entire semiconductor wafer.

The block memory described above represents a memory building block of about 4 K bits capacity which are stackable in series with interconnecting "repeaters" to form the stack structure described. Data within each block is accessible in a page mode and non-addressed blocks are transparent to data permitting the through transfer of pages of data. Random row access is available from within stacked blocks and refresh operations are performed locally within each block. A defective block does not impede access to and from other blocks and the largest defect free unit required is the block of about 4 K bits which is a conservative requirement. The small cell size permits the use of well practised fabrication processes, that is, fabrication is achieved by means of conservative, and therefore, low cost, technology. The operating power level of the block memory is that consistent with charge switching, and low power operation is maintained throughout operation by localised refresh rather than general refresh.

FIG. 12 is an alternative representation to that used in FIG. 1 for the memory cell, the combination of the PNP transistor 2 and the PNP transistor 3 being represented as a thyristor with access to both its second layer electrode and its third layer electrode. The active device part of the memory cell is most easily recognised as a four-layer vertical structure (that is, a thyristor structure) by referring to FIG. 3 in which the layers 10, 11, 12 and 16 will be seen to provide a vertical P, N, P, N structure. The word line contact 7 makes contact directly with the P-layer 10, the C line contact 8 acts as one plate of the cell capacitor while the N layer 11 acts as the other plate, and the R line contact 9 is connected to the part of the P-layer 12 which is not under the N layer 11, the bulk resistance of the P-layer 12 below the R line contact providing the resistor between the active device and the R line. Although the thyristor representation of the cell reflects its structure, cell operation will continue to be explained in terms of the PNP/NPN transistor representation of the active device since such representation facilitates the understanding of cell operation.

Referring to FIG. 13, an alternative form for the data storage element of FIG. 1 has the third transversely extending conductor 9 held at earth potential rather than being connected to a control signal source. The remaining components of the data storage element of FIG. 1, that is, the capacitor 1, the transistors 2 and 3, the resistor 4, the current sink 5 (not shown in FIG. 13), the first transversely extending conductor 8 (the C line), the second transversely extending conductor 7 (the WORD line), and the longitudinally extending conductor 6 (the BIT line), are unaltered.

The data storage element or cell represented by FIG. 13 keeps the FIG. 1 arrangement for controlling the charge on the capacitor 1 by virtue of the connection of one terminal of the capacitor 1 to the C line 8 and the provision for charging the capacitor 1 by way of the WORD line 7 and the emitter-base diode of the transistor 2, that is, the WRITE 0 margins for the FIG. 13 arrangement are more or less the same as those for the FIG. 1 arrangement and are closer together than would be the case where the charging of the capacitor 1 is not so fully controlled. Therefore the FIG. 13 arrangement has substantially the same READ 0 margins as does the FIG. 1 arrangement, so the upper noise margin remains the same. However, the WRITE 1 margins of the FIG. 13 arrangement extend beyond those of the FIG. 1 arrangement because the WRITE 1 condition in the FIG. 13 arrangement is not controlled by the use of the R line 9, the R line 9 having been dispensed with as a controlling line, and therefore the noise immunity of the FIG. 13 arrangement may be expected to be somewhat less than that of the FIG. 1 arrangement.

The resistor 4, which shunts the base-emitter circuit of the transistor 3, is retained, and the base voltage level of the transistor 3 is clamped to zero volts at all times through the resistor 4, so this aspect of the noise immunity behaviour of the cell remains unaltered.

The data storage element or cell represented by the FIG. 13 arrangement is operated as follows as illustrated by FIG. 14:

1. Writing of a logical "0" to the cell

Referring to FIG. 14, the writing of data to the cell occupies a period made up of three sub-periods $t_1$, $t_2$ and $t_3$. At the start of the period the voltage level of the WORD LINE 7 is raised from zero and at the same time the voltage level of the BIT LINE 6 is raised from zero, the WORD LINE 7 and the BIT LINE 6 both being held at their respective elevated voltage levels over the period $t_1+t_2+t_3$. The C LINE 8 is initially at a voltage level above zero and is brought down to zero voltage for the sub-period $t_2$ and returned to the voltage level above zero at the end of the sub-period $t_2$.

The effect of the raised voltage level of the WORD LINE 7 and the reduction of the voltage level of the C LINE 8 to zero during the sub-period $t_2$ is to cause the charging of the capacitor 1 by way of the emitter-base junction of the transistor 2, the plate of the capacitor 1 connected to the base of the transistor 2 being the higher voltage plate. The effect of the raised voltage level of the BIT LINE 6 during the period $t_1+t_2+t_3$ is to prevent the transistor 3 being switched on by the current reaching the resistor 4 by way of the transistor 2 during charging of the capacitor 1. At the end of the sub-period $t_3$, the voltage level of the WORD LINE 7 is returned to zero, the voltage level of the C LINE 8 is returned to a positive value, and the voltage level of the BIT LINE 6 is returned to zero. The plate of the capacitor 1 connected to the base electrode of the transistor 2 is now positively charged with respect to the plate connected to the C LINE 8. Further, the change in the voltage level of the C LINE 8 at the end of the sub-period $t_3$ is transferred across the capacitor to raise the voltage level of its plate connected to the base electrode of the transistor 2 by the voltage rise of the C LINE 8.

2. Reading the cell when it holds a logic "0"

The operating conditions of the cell for performing the reading operation are as illustrated for the period $t_4$ in FIG. 14. As shown, the voltage level of the WORD LINE 7 is raised from zero for the period $t_4$ and the voltage level of the C LINE 8 is maintained high through the period $t_4$. The voltage level of the BIT LINE 6 is monitored during the period $t_4$, and, as shown, the voltage level of the BIT LINE 6 remains at zero indicating that the cell is holding logical "0" data. The charge held by the capacitor 1 is such as to keep the transistor 2 biassed off even when the voltage level of the WORD LINE 7 rises for the "read" operation during $t_4$ which results in the WORD LINE voltage level failing to switch on the transistors 2 and 3 and the logical "0" condition being detected at the BIT LINE 6.

3. Writing of a logical "1" to the cell.

Referring to FIG. 15, the writing of a logic "1" is carried over the period made up of the sub-periods $t_1$, $t_2$ and $t_3$. As before, the voltage level of the WORD LINE 7 is raised from zero to a positive value for the total period $t_1+t_2+t_3$, the voltage level of the C LINE 8 is brought down from a positive value to zero for the sub-period $t_2$, and the voltage level of the BIT LINE 6 is held at zero for the total period $t_1+t_2+t_3$.

The effect of the raised voltage level of the WORD LINE 7 and the reduction of the voltage level of the C LINE 8 to zero during the sub-period $t_2$ is to cause the charging of the capacitor 1 by way of the emitter-base junction of the transistor 2, as before, but in this instance the current passing through the transistor 2 and reaching the base of the transistor 3 switches it on because current can flow by way of its emitter electrode into the zero voltage level BIT LINE 6. Charge initially received by the capacitor 1 is now removed through the transistor 3 and the transistors 2 and 3 act to supply base current to each other to maintain each other conductive. When the WORD LINE voltage level returns to zero at the end of the sub-period $t_3$ the capacitor is substantially discharged.

4. Reading the cell when it holds a logical "1"

Reading of the cell is carried out, as before, by raising the voltage level of the WORD LINE 7 as shown for the period $t_4$ in FIG. 15 and monitoring the BIT LINE 6, the result being in this case that the BIT LINE 6 shows a voltage level change corresponding to that for the WORD LINE 7, indicating that the cell holds logical "1" data. The fact that the capacitor 1 is discharged permits the emitter-base junction of the transistor 2 to become forward biassed when the WORD LINE voltage level is raised. The transistor 2 conducts and switches on the transistor 3, each transistor then maintaining the other in the conductive state, and effectively connecting the WORD LINE 7 to the BIT LINE 6 where the WORD LINE excitation is sensed to indicate the logical "1" condition of the cell.

Referring to FIG. 13, it will be noted that the cell includes the parasitic capacitances represented by the capacitor 40 (emitter-base capacitance of the transistor 2), the capacitor 41 (base-collector capacitance of the transistor 2 and the base-collector capacitance of the transistor 3), the capacitor 42 (base-emitter capacitance of the transistor 3), and the capacitor 43 (the BIT LINE capacitance).

The capacitor 41 is significant in the operation of the cell when, during the writing operation, the cell has been loaded with a logical "0". That is, the capacitor 1 is charged (the logical "0" condition). As has been explained, the capacitor 1 is changed when the BIT LINE 6 is held at a positive voltage level, the WORD LINE 7 is held at a positive voltage level and the C LINE 8 is held at zero voltage level, the plate of the capacitor 1 connected to the base electrode of the transistor 2 achieving a voltage level slightly less than that of the WORD LINE 7 (the difference being the emitter-base voltage drop for the transistor 2) and the other plate of the capacitor 1 being at the C LINE voltage level of zero volts. The subsequent rise of the C LINE voltage to a positive value is communicated across the capacitor and there is a corresponding rise in the voltage level at the junction of the capacitors 1 and 41, part of the voltage level rise being communicated across the capacitor 41 to its junction with the resistor 4. The voltage rise at the junction of the resistor 4 and the capacitor 41 cannot be maintained since charge leaks away through the resistor 4 and in due course the capacitors 4 and 41 reach a steady state in which the voltage change in the C LINE 8 is shared by them in the inverse ratio of their capacitances, the major part of the voltage change being absorbed by the capacitor 1 but the change still being less than the full change in the voltage level of the C LINE 8. This slight fall in the voltage level at the base electrode of the transistor 2 is a consequence of the presence of the resistor 4 connected to the controlled potential provided by the line 9 and this arrangement avoids the possibility of the cell being unable to respond to the rewriting of a logic "0" by a logic "1". If, for example, the resistor 4 is disconnected, the connection of the collector electrode of the transistor 2 to the base electrode of the transistor 3 would be free to "float" which would lead to difficulty in overwriting the logical "0" condition by logical "1" condition.

The arrangement represented by FIG. 13 will also include some BIT LINE capacitance shown as a capacitor 43. It will be noted from FIGS. 14 and 15 that reading the cell when it contains a logical "0" results in the cell blocking connection of the WORD LINE 7 to the BIT LINE 6, that is, the BIT LINE capacitor 43 will receive no charge through the cell when the cell holds a logical "0". Reading the cell when it holds a logical "1" results in the cell connecting the WORD LINE 7 to the BIT LINE 6 and the BIT LINE capacitor 43 will become charged.

Data is written into the cell by way of the BIT LINE 6, and, therefore, the BIT LINE condition after reading the cell may be written into the cell as a means of refreshing the cell data, that is, the cell refresh operation is performed as the read-write sequence. This read-write sequence refreshes the cell data with inversion and action is necessary to accommodate this. Suitable action may be the use of reference data to indicate when the cell data is inverted or the monitoring of the refresh cycles (the data will be upright again after two refreshes or inverted on odd refresh cycles and upright on even refresh cycles.)

The operation of the R LINE 9 as a fixed potential (earth) line leads to the possibility of the cells being arranged in pairs sharing an R line 9 as illustrated by FIG. 16. As represented by FIG. 16, two adjacent cells including transistors 2, 2a, 3 and 3a, capacitors 1 and 1a, resistors 4 and 4a, WORD LINES 7 and 7a, C LINES 8 and 8a, and a BIT LINE 6, share an R line 9.

A monolithic structure for the arrangement represented by FIG. 16 is illustrated in cross-section by FIG. 17, from which it will be noted that the cells are mirror images of each other about the N+ isolating diffusion (shown dotted). The shared R line 9 as shown in FIG. 16 extends over the N+ diffusion separating the two cells and its double width provides for lower R LINE resistance compared with cells with individual R lines. As an alternative construction, the N+ diffusion separating the cells may be dispensed with (the N+ isolation diffusion is shown dotted to indicate this) and the overall width of the shared R line made less than double width but still more than single width, there being then a shared R line contact for the two cells.

The structures represented by FIGS. 13, 16 and 17 provide advantages in relation to the structures represented by FIGS. 1 and 3, say, including the following:

1. The unique R line of the arrangement of FIGS. 1 and 3 is replaced by a universal ground line allowing easier distribution of the ground line across the array.

2. The R line driver on each row of the arrangement of FIGS. 1 and 3 is eliminated which provides for more compact row drivers. Also, there is no rise in R line voltage caused by a voltage rise across the row drivers.

3. The R lines may be shared by adjacent cells in pairs arranged "back-to-back" as represented by FIGS. 16 and 17, leading to the possibility of using wider R lines (resulting in reduced voltage rise across an array of the cells) and more relaxed linewidth/registration/spacing requirements as a result of a halving in the number of R lines.

4. The R line contacts may be shared by adjacent cells in pairs providing for the elimination of the isolation diffusion between adjacent cell pairs and a 16.7% reduction in cell size. This alteration is conditional upon the parasitic transistor created by the removal of the isolation diffusion showing acceptably low gain so as not to influence cell operation adversely.

5. The refresh latches may be eliminated resulting in a 3% reduction in 4 K block size and the need for fewer timing signals for controlling the cells.

6. The read/write cycle is simplified and reduced by the elimination of the BIT LINE precharge and discharge operations required for the arrangements represented by FIGS. 1 and 4, making an array of the cells compatible with other forms of memory cell arrays, and the power dissipation in the memory cells is reduced by the need for fewer charging and discharging operations.

The cell arrangements represented by FIGS. 1 and 3 are distinguished in performance from those of FIGS. 13 and 16 in that the condition of the cell capacitor of FIGS. 1 and 3 when a logical "1" is written to the cell is dictated by the control waveform amplitudes whereas the corresponding condition in the FIGS. 13 and 16 arrangements are dependent on the saturation voltage for the cell, resulting in the cell saturation voltage becoming a parameter of the cell noise margins.

Referring to FIG. 18, a memory block structure made up of the memory cells represented by FIG. 13 includes a memory block 180, a bit line discharge block 181, and a block 182 of transfer gates for moving data out of the memory block structure. The memory block 180 includes 32 rows by 128 columns of memory cells giving it a nominal capacity of 4 K bits and is provided with 32 word lines (W0 to W31) and 32 C lines (C0 to C31) running across the structure and 128 bit lines running along the structure. The bit line discharge block 181 includes a grounded emitter transistor for each bit line to permit the bit lines to be discharged by a control signal BD. Each bit line also passes to the transfer gate block 182 which is arranged to transfer out in parallel the data available on the bit lines. The transfer gate block 182 operates under the control of a signal XFR.

The operation of the memory block structure represented by FIG. 18 involves the transfer and writing of data into the memory block, the reading of data in the memory block and its transfer out of the memory block, and the periodic refreshing of the data held in the memory block. In the transfer and writing of data into the memory block, the bit line discharge block 181 will be activated to clear all the bit lines and data to be written to the cells will be applied to the bit lines shown generally as an input port 183 while the W and C lines are energised appropriately to cause the input data to set the charges on the cell capacitors. In the reading of the data in the memory block and its transfer out of the memory block, the bit line discharge block 181 will be activated to clear all the bit lines and the transfer gate block 182 will be activated while the W and C lines are energised appropriately to cause the bit line conditions to reflect the data stored in the cells of the block and the data to become available at an output port 184. Memory block refresh is carried out immediately after the reading operation by writing the condition of the bit lines back into the memory block, that is, a refresh operation is included in the reading part of the operation, this being carried out after the transfer gate block 182 has been de-activated. A separate refresh operation is also available, this being the same as a reading operation as regards the control of the W and C lines and the bit line discharge block 181 and differing from the reading operation in requiring the transfer gate block 182 to remain deactivated throughout the operation.

Suitable signal waveforms for the read, write and refresh operations of the memory block of FIG. 18 are represented by FIG. 19. Each of the three operations to be carried out is completed within a cycle occupying five time slots $t_1$ to $t_5$ and the signals labelled W, C, BD and XFR are those applied respectively to the W lines, the C lines, the bit discharge block 181, and the transfer gate block 182 of FIG. 18.

Referring to FIG. 19 and considering the reading operation (READ), the bit line discharge block 181 is activated by providing a positive signal BD during the period $t_1$ to discharge the bit line capacitance. The transfer gate block 182 is activated during the period $t_2$ by reducing the signal XFR to zero and the cell is read by providing a positive signal W for the period $t_2$. The signal XFR is returned to its original value at the end of the period $t_2$ while the signal W is maintained at the positive value over the next period $t_3$ in order to charge the bit line fully when the activated cell holds a logic "1". The remainder of the operation occupies the period $t_4$ and the period $t_5$, the signal C being taken from its positive value to zero during the period $t_4$ and returned to its positive value during the period $t_5$, while the signal W is maintained at a slightly reduced positive value during the periods $t_4$ and $t_5$.

The operations occupying the periods $t_4$ and $t_5$ represent the refreshing of the cell capacitance charge by charging the cell capacitance (logical "0") during the period $t_4$ and then discharging it or not during the period $t_5$, according to the condition of the bit line which is not controlled during this operation and which was previously loaded with the cell capacitance data as explained above. It will be noted therefore that the cell refresh operation is included in the READ operation illustrated. Should it be necessary to do a data refresh without providing output data, the REFRESH operation may be used. Comparison of the READ and REFRESH operations reveals that the only difference in the two operations is that the signal XFR does not change during REFRESH, and therefore data is not transferred out of the memory block during REFRESH, the remainder of the control signals being as for the READ operation.

Referring to the writing operation (WRITE), the signal BD is taken from zero to a positive value during the period $t_1$ at the end of which BD is returned to zero where it remains. At the beginning of the period $t_2$ which coincides with the end of the period $t_1$, the signal XFR is taken from a normally positive value to zero and returned to the normally positive value at the end of the period $t_2$. No change takes place in the signal W during the periods $t_2$ and $t_3$ and it is kept at zero during those periods (reading is not required). During the period $t_4$ the signal W is taken from zero to a positive value and during the same period the signal C is taken from its normally positive value to zero and returned to its normally positive value at the end of the period $t_4$. The signal W is maintained at its positive value up to the end of the period $t_5$ and then returned to zero. Data to be written to the cell will be applied to the bit line data input during the period $t_4$ and will be written into the cell during the periods $t_4$ and $t_5$.

A memory stack structure, using memory blocks such as those represented by FIG. 18, is arranged as represented by FIG. 20 in which a stack eight blocks deep includes an upper memory block 250 (block O), a lower memory block 254 (block 7), and intermediate blocks represented generally by the block 252. The memory blocks 250, 252 and 254 have their associated bit discharge and transfer gate blocks which are represented by the blocks 251, 253 and 255. The memory stack includes a data input port 256 and a data output port 257. Each memory block is connected to an associated row driver which provides the necessary W, C, BD, and XFR waveforms, the memory block 250 being connected to the row driver 258, the memory block 252 being connected to the row driver 259, and the memory block 254 being connected to the row driver 260. Each row driver is connected to its own row address register, there being row address register 261 connected to the row driver 258, the row address register 262 connected to the row driver 259, and the row address register 263 connected to the row driver 260. External clock signals are introduced at the input ports of the row drivers 258, 259 and 260 along a clock bus 264.

In the operation of the memory stack structure represented by FIG. 20, only one block at a time may be executing its WRITE operation or its READ operation but several or all the blocks may be executing REFRESH operatons at the same time. When data is to be written to any block, the data is introduced at the input port 256 and passed through the transfer gates of the blocks between the input port 256 and the destination block which will be the only block on a WRITE operation. Similarly, data being read from any block will be passed through the transfer gates of the blocks between the supply block and the data output port 257, and the block being read will be the only one on a READ operation.

The data input and data output ports of the memory stack structure of FIG. 20 are represented by FIG. 21 which is now referred to. The memory stack is represented by the block 270. The data input port includes a serial to parallel conversion arrangement of thirty two registers 272 connected serially and one hundred and twenty eight transfer gates arranged in four rows with thirty two gates per row. The arrangement of thirty two gates per row in four rows provides a transfer capacity of one hundred and twenty eight bits. The first of the thirty two registers 272 is connected to the transfer gates 274, 277, 280, and 283, the second of the registers 272 is connected to the transfer gates 275, 278, 281 and 284, and so on, until finally the last of the registers 272 is connected to the transfer gates 276, 279, 282 and 285. The data output port includes a parallel to serial conversion arrangement of thirty two registers 273 connected serially, one hundred and twenty eight data latches arranged in four rows with thirty two data latches per row, and transfer gates represented as a block 271. There are one hundred and twenty eight output transfer gates in the block 271 connected in the same way as the transfer gates for the input port. The data output port provides a transfer capacity of one hundred and twenty eight bits from the memory stack 270 and delivers the data in serial form by way of the registers 273. The output transfer gates, represented by the transfer gate block 271, are connected to respective output data latches the first four of which are 286, 289, 292 and 295, the next four of which are 287, 290, 293 and 296, and the last four of which are 288, 291, 294, and 297. The data latches hold data fed out from the respective transfer gates for delivery to the output registers 273.

In the operation of the memory stack 270 shown in FIG. 21, data will be written into the memory stack 270 and will be introduced first in serial form into the input registers 272. Thirty two bits of input data will be accommodated in the input register 272 and the first thirty two bits required will be bit 0, bit 4, bit 8 . . . bit 120, and bit 124. When these thirty two bits have been loaded into the input registers 272 the transfer gates 270 (bit 0), 275 (bit 4) . . . 276 (bit 124) will be activated to pass the data into the stack 270. This data will be memorised as the charge on the bit lines for memory elements at positions 0, 4 . . . 124 of one of the rows of the memory stack 270. Next, a further thirty two bits of input data (bit 1, bit 5, bit 9 . . . bit 121, bit 125) will be loaded into the input registers 272, the transfer gates 277 (bit 1), 278 (bit 5) ... 279 (bit 125) will be opened to move the data to the memory stack 270, and the data will be memorised as the charge on the bit lines for elements at positions 1, 5, ... 125 of the same row as before. The procedure is repeated for the next thirty bits which are bit 2, bit 6, bit 10 ... bit 122, and bit 126 and again for bit 3, bit 7 ... bit 123 and bit 127, by which time the complete row of one hundred and twenty eight bits will have been memorised as bit line charges in the memory stack 270, when the memory stack 270 is taken through a WRITE operation to move the data into the memory cells. The procedure for writing the complete row of one hundred and twenty eight bits is repeated for as many rows as there are in the memory stack 270 until the memory stack 270 is filled. Data read from the memory stack 270 will be transferred out through the output transfer gates 271 in groups of thirty two bits, in the same manner as transferred through the input transfer gates, and stored in the data latches for transfer to the output latches 273. The controlling signals required for operating the data input and data output ports are represented by FIG. 22.

Referring to FIG. 22, the upper group of waveforms provide for the writing into the memory stack 270 of data present at the data input port, the waveform (DCLK) effecting the successive introduction of four groups of thirty two bits of data to the input registers 272, the four waveforms (XFRIN0 to XFRIN3) effecting the successive transfer of the four groups of data from the data registers 272 to the bit lines of the memory stack 270 along a complete row, the two waveforms (W,C) effecting the writing of the data from the bit lines into the memory cells, the waveform BD effecting the discharge of the bit lines for the block of memory cells being written to, and the waveform XFR effecting the opening of transfer gates for the block of memory cells being written to.

Referring still to FIG. 22, the lower group of waveforms provide for the reading of data from the memory stack 270, the waveform (BD) effecting the initial discharge of the bit lines, the waveform (XFR) effecting the opening of transfer gates of the memory block, the waveforms (W,C) effecting the reading of the cells (leaving the data on the bit lines) and the refreshing of the cell data, the waveforms WOUT0 to WOUT4 effecting the loading of the row of data into the data latches, and the waveform (DCLK) effecting the transfer of data from the data latches as four groups of thirty two bits for generating a serial data output.

Referring to FIG. 23, a more conventional memory structure based on the memory array includes a row address decoder 368, a row address driver group 369, a column address decoder 365, a column selector 364, a plurality of the memory arrays 350, 351 and 352 with row buffer groups 353 and 354, a read/write controller 366, a bit line controller 367, bit line discharge groups 358, 359 and 360, and ports 355, 356, 357, 361, 362 and 363. The memory structure is conventional in having the memory cells arranged according to row and column coordinates. The cells themselves are, however, operated by the use of W C, and bit lines. The memory arrays 350 and 351 are separated by a row buffer group 353. The row buffer group 353 is arranged to be driven by the row address signals of the memory array 350 and to pass the row address signals on to the memory array 351. The row buffer group 353 has the effect of reducing the power required from the row address driver group 369 by acting as a repeater for the address driver group 369. The row buffer group 353 acts in the same way as a repeater controlling the row addressing of the array 352.

Referring to FIG. 24, the control waveforms for the memory structure of FIG. 23 include the W (W clock), C(C clock), and bit discharge (BD) control signals described previously.

Referring to FIG. 24, operation starts with the addressing of a row of the memory (ROW ADDRESS). The addressing of a column of the memory (COL ADDRESS) is then carried out. The discharge of the bit line (BD) is carried out soon after the row addressing and before the column addressing for a duration $t_1$ and, at the end of the bit line discharge operation and at a time $t_2$ after the application of the row address, the W signal (W clock) read pulse is applied for a duration $t_5$. There is an access time of $t_3$ following the application of the W signal and an access time of $t_4$ following the application of the column address with the result that the data output from the memory is valid at a time $t_2+t_3$ from the application of the row address and at a time $t_4$ from the application of the column address. A read/write (R/W) signal is maintained at its high level during the reading of data from the memory and up to a time $t_6$ from the end of the W signal, the data having been read from the memory before the time $t_6$ from the end of the W signal but remaining valid for slightly longer than the time $t_6$ from the end of the W signal. Data to be written into the memory is presented to the memory when the R/W signal is taken from its high level to its low level for a period $t_8$ to place the data on the bit line as a charge, and, at the end of the bit line energisation, the C signal (C clock) is taken from its high level to its low level for a period $t_9$ to transfer the data into the memory. The operation is completed by the W signal (W clock) returning to its low level.

FIG. 25 illustrates the memory arrangement of FIG. 23 with its input and output ports identified in terms of the functions associated with a conventional DRAM arrangement. As represented by FIG. 25, the memory arrangement requires address inputs (Ao - An), data in and data out, a row address strobe (RAS), a column address strobe (CAS), a write enable input (WE), and W, C, BD and R/W inputs which would replace the power supply inputs required for conventional DRAM.

FIG. 26 illustrates a configuration of four memory arrangements, such as those represented by FIG. 23, positioned with the row address decoder 368 and column address decoder 365 forming central crossed backbones about which the memory arrays 450, 451, 452 and 453 are positioned.

Referring to FIG. 27, an alternative arrangement to that of FIG. 20 for a stack of a plurality of memory arrays is illustrated as a first memory array 500 and a second memory array 501 connected serially by the bit lines 502 and 503 which include switches providing some choice of routes from one memory array to the other. The arrangement of switches included with the bit lines is shown in detail in FIG. 29 from which it will be noted that, for the memory array 500, say, an incoming connection 510 separates into two bit lines with respective switches 512 and 513 controlled by different signals XFR IN ODD and XFR IN EVEN on respective signal paths 516 and 517. A second incoming connection 511 separates into two more bit lines with switches 514 and 515 controlled also by XFR IN ODD and XFR IN EVEN. On the output side of the memory array 500 the bit lines are combined in pairs through switches 518, 519, 520 and 521 and are connected to half as many output connections (such as 522 and 523) as there are output bit lines.

Referring to FIG. 29, the switches 512 and 513 may be activated individually in order to connect the input connection 510 to each of the associated bit lines, in turn, or the switches 512 and 513 may be activated at the same time to bring both bit lines into operation. The same is true of all the other switches, bit lines, and connections represented in FIG. 29. FIG. 30 is a more detailed representation of FIG. 29 showing the switches as bipolar transistors.

Referring to FIG. 28, an alternative representation of the stack structure represented by FIG. 27, as amplified by FIGS. 29 and 30, includes two sub-arrays, side by side, each contributing n/2 bits where the overall array width of FIG. 27 is n bits, with interleaved connections totalling n/2 which connect to n bit lines through n switches, generally as illustrated by FIGS. 29 and 30.

Referring to FIGS. 29 and 30, the order of bit lines is identified as "odd", "even", "even", "odd", "odd", "even," "even", "odd" and so on to provide the interleaved structure, where "odd" refers to one subarray and "even" refers to the other sub-array. In this interleaved structure, a fault represented by an open-circuit bit line will result in one of the subarrays failing to operate and the other sub-array being available for normal operation including through communication. A fault represented by an "odd-odd" or an "even-even" bit line short circuit will result in either the "odd" sub-array or the "even" sub-array being defective while the other operates normally. A fault represented by an "odd-even" bit line short circuit will result in one of the sub-arrays remaining operative, two of the cells at the defect then operating as one.

During operation of the memory stack represented by FIGS. 27, 28, 29 and 30, an array which is in use only for the passing on of data is operable as either the "odd" or the "even" sub-array, according to which connection switches are activated. When the array is being operated in either the read or the write mode, the appropriate "odd" or "even" switches are activated to provide access to one sub-array and leaving the other sub-array disconnected. However, a read or write operation to a sub-array refreshes the other subarray. Control data for operating the interleaved structure will include an indication as to whether "odd" or "even" sub-array operation is required and to effect energisation of the appropriate switches for the input and output connections.

I claim:

1. A dynamic electrical data storage element which provides for alteration of its stored data, including:
    switch means having first and second regions and first and second control ports, through which control ports the switch means is controllable to be set to a first or a second state corresponding to the regions being connected to each other or disconnected from each other,
    electrical charge storage means connected to so control said switch means, by way of one of its control ports, that the switch means assumes one of its two possible states when the charge on the charge storage means lies within a first range and the switch means assumes a the other of its two states when the charge on the charge storage means lies within a second range which excludes the first range,
    a first address line connected to the first region of the switch means,
    a second address line connected to the charge storage means, and
    a data line connected to the second region of the switch means,
    so that, in operation, data is written into the data storage element as a charge set on the charge storage means by signals applied to the data storage element by way of the address lines and data line, and data held by the data storage element is read by sensing the state of the switch means by way of the first address line and the data line.

2. A data storage element as claimed in claim 1 wherein
    the switch means is a four-layer (PNPN) semiconductor device in which a first gate electrode is connected to the second layer to provide the first control port,
    a second gate electrode is connected to the third layer to provide the second control port,
    the first address line is connected to the first layer of the four-layer device,
    the second address line is connected to the second layer of the four-layer device by way of a capacitive element,
    the data line is connected to the fourth layer of the four-layer device, and
    the third layer of the four-layer device is connected to a further line of the data storage element by way of a resistive element.

3. An electrical data storage element as claimed in claim 1, wherein
    the switch means includes interconnected first and second switch elements controlled through the first and second control ports to cause the switch means to attain its closed circuit condition,
    the first address line is connected to the first switch element,
    the electrical charge storage means is connected between the first control port and the second address line, and
    the data line is connected to the second switch element, so that in operation, the charge condition of the charge storage means is set by independent control of the switch elements by way of the address lines and the data line in writing data into the data storage element, the charge condition of the charge storage means being effective to cause the switch means to assume its closed circuit condition or to remain open circuit when the data storage element is read.

4. An electrical data storage element which provides for alteration of its stored data, including:
    switch means having first and second regions interconnected by a connection path controllable by first and second control ports to set the switch means in a first state or a second state corresponding to states of the connection path,
    electrical charge storage means connected to so control the switch means, by way of one of its control ports so that the switch means assumes one of its two possible states when the charge on the charge storage means lies within a first range and the switch means assumes the other of its two possible states when the charge on the charge storage means lies within a second range which excludes a first range,
    a resistive element connected to the connecting path of the switch means, a first address line connected to the first region of the switch means, a second address line connected to the charge storage means, a data line connected to the second region of the switch means, and a further line connected to the resistive element so that, in operation, data is written into the data storage element as a charge set on the charge storage means by signals applied to the data storage element by way of the address lines and the data line, and the data held by the data storage element is read by sensing the state of the switch means by way of the first address line and the data line.

5. An electrical data storage element as in claim 4 wherein said storage element is dynamic 6. A data storage element as claimed in claim 4, wherein the switch means is a four-layer (PNPN) semiconductor device with a first gate electrode connected to the second layer, to provide the first control port, and a second gate electrode connected to the third layer to provide the second control port.

7. A data storage element as claimed in claim 5, wherein the switch means is a four-layer (PNPN) semiconductor device in which a first gate electrode is connected to the second layer to provide the first control port, a second gate electrode is connected to the third layer to provide the second control port, the first address line is connected to the first layer of the four-layer device, the second address line is connected to the second layer of the four-layer device by way of a capacitive element, the data line is connected to the fourth layer of the four-layer device, and the further line is connected to the third layer of the four-layer device by way of the resistive element.

8. A data storage element as claimed in claim 6, wherein the upper three layers (PNP) of the semiconductor device and the lower three layers (NPN) of the semiconductor device provide interconnected first and second switch elements.

9. An electrical data storage element as claimed in claim 4, wherein, in operation, signals are applied to the further line to provide additional control of the charge storage means 10. An electrical data storage element as claimed in claim 4, wherein, in operation, the further control line is maintained at a fixed voltage level and the charge conditions of the charge storage means are determined to a degree by the characteristics of the switch means.

11. An electrical data storage element as claimed in claim 10, wherein, in operation, the capacitance of the data line is used to store charge for transfer as data into the data storage element, and subsequent reading of the data from the data storage element leaves the data line charged correspondingly to the data stored in the data storage element, this condition permitting the return of the data line charge to the data storage element to effect refreshing of the data storage element.

12. An electrical data storage element as claimed in claim 5, formed as a monolithic semiconductor structure including a first layer (P type),
a second layer (N type), and
a third layer (P type), the layers being of generally rectangular form having their major dimensions set in the same direction with the first layer lying wholly within the second layer and the second layer lying wholly within the third layer, the capacitive element being provided by part of the second layer, an N-type semiconductor strip and a dielectric layer separating the part of the second layer from the N-type semiconductor strip, the resistive element being provided by the bulk resistance of part of the thirs layer along which lies a P-type semiconductor strip, and a fourth N-type layer of generally rectangular shape having its major dimension in a direction orthogonal to the main dimensions of the other layers.

13. An electrical data storage element as claimed in claim 12, in which the fourth layer acts as a trap for stray charges generated in the substrate material of the monolithic structure and protects the charge stored in the capacitive element from corruption by stray charges.

14. A plurality of data storage elements as defined in claim 5, arranged in an array of rows and columns with the elements of each row connected to the address lines which are set along the rows and the elements of each column connected to the data lines which are set along the columns.

15. A plurality of data storage elements as claimed in claim 13, in which the orientations of the elements are the same throughout the array.

16. A plurality of data storage elements as claimed in claim 15, wherein, in operation, the second control ports of the switch means of the data storage elements are provided with control signals.

17. A plurality of data storage elements as claimed in claim 16, including an additional data storage element for each column of the array for refreshing data held by the data storage elements, in operation, the data being passed from the data storage elements of the array to the additional data storage elements and being returned to the data storage elements of the array to refresh them.

18. A plurality of data storage elements as claimed in claim 14, in which the orientations of the elements alternate from row to row to provide rows in pairs in which the elements are mirror images of each other.

19. A plurality of data storage elements as claimed in claim 18, in which the elements of the pairs of rows have a common connection to the second control ports which common connection, in operation, is held at a fixed voltage level.

20. A plurality of data storage elements as claimed in claim 14, formed as a monolithic structure in which the data storage elements are arranged in a uniform pattern of rows and columns, the address lines and lines to the second control ports are set along the rows and are connected to the elements in the rows, and the data lines are set along the columns and are connected to the elements in the columns.

21. A plurality of data storage elements as claimed in claim 20, formed as a monolithic structure in which the address lines and the lines to the second control ports are set on the surface of the monolithic structure and the data lines are set within the monolithic structure.

22. A memory block including a plurality of data storage elements arranged in an array as claimed in claim 14, and transfer gates for moving data into and out of the array.

23. A memory block as claimed in claim 22, including an interleaved array of data storage elemetns in which the elements of the array belong to two sub-arrays the elements of which are dispersed throughout the array, the data lines of the arrays being connected through respective groups of transfer switches to input lines each of which is connected to a switch to a data line for one sub-array and to a switch to a data line for the other sub-array.

24. A memory block as claimed in claim 23, in which the sub-arrays are identified as "odd" and "even", and the order of data storage elements in each row is "odd," "even", "even", "odd" "odd", "even", "even" "odd", and so on.

25. A memory stack including a plurality of memory blocks as claimed in claim 22, wherein the memory blocks are positioned one above the other with communicating transfer gates between the memory blocks to facilitate the flow of data thrugh the stack.

26. A memory stack as claimed in claim 25, including an input demultiplexer and an output multiplexer in combination with shift registers to facilitate the transfer of data to and from the memory stack in word-lengths shorter than the full width of the stack.

27. A row and column addressable memory including a plurality of memory blocks as claimed in claim 22, the memory blocks being arranged side by side with row address decoders for selecting one row through the blocks and column address decoders for selecting one of the blocks.

28. A row and column addressable memory as claimed in claim 27, including row buffers separating the memory blocks, the row buffers acting as repeaters for the row address signals to reduce the power required from the row drivers.

29. A memory stack including:
a plurality of memory blocks, each block comprising a plurality of data storage elements each of which provides for alteration of its stored data, and each of which data storage elements includes switch means having first and second regions and frist and second control ports, through which control ports the switch means is controllable to be set to a first state or a second state corresponding to the regions being connected to each other or disconnected from each other, electrical charge storage means connected to so control the switch means, by way of one of the control ports of the switch means, that the switch means assumes one of its two possible states when the charge on the charge storage means lies within a first range and the switch means assumes the other of its two possible states when the charge on the charge storage means lies within a second range which excludes the first range, a first address line connected to the first region of the switch means, a second address line connected to the charge storage means, and a data line connected to the second region of the switch means, so that, in operation, the data to be held by the data storage element is written into it as a charge set on the charge storage means by signals applied to the data storage element by way of the address lines and the data line, and the data held by the data storage element is read by sensing the state of the switch means by way of the first address line and the data line, said data storage elements being arranged in an array of row and columns with the elements of each row connected to the address lines which are set along the rows and the elements of each comlumn connected to the data lines which are set along the columns, and transfer gates for moving data into and out of the array, said memory blocks being positioned one above the other with communicating transfer gates between the memory blocks to facilitate the flow of data through the stack;

an input demultiplexer and an output multiplexer in communication with shift registers to facilitate the transfer of data to and from the memory stack in word-lengths shorter than the full width of the stack; and the multiplexer function being achieved by the use of particular address, control and data signals applied to selected ones of the data storage elements.

* * * * *